United States Patent
Masuda et al.

[11] Patent Number: 6,097,081
[45] Date of Patent: Aug. 1, 2000

[54] SEMICONDUCTOR DEVICE HAVING ADHESIVE BETWEEN LEAD AND CHIP

[75] Inventors: Masachika Masuda, Tokorozawa; Michiaki Sugiyama, Tokyo, both of Japan

[73] Assignees: Hitachi, Ltd.; Hitachi ULSI Engineering Corp., both of Tokyo, Japan

[21] Appl. No.: 09/005,777

[22] Filed: Jan. 12, 1998

[30] Foreign Application Priority Data

Jan. 16, 1997 [JP] Japan .................................. 9-005134

[51] Int. Cl.[7] .................................................. H01L 23/495
[52] U.S. Cl. ............................................. 257/666; 257/691
[58] Field of Search ..................... 257/666, 691, 257/735, 668, 694, 690

[56] References Cited

U.S. PATENT DOCUMENTS 4,943,843  7/1990  Okinaga et al. .
5,068,712  11/1991  Murakami et al. .
5,872,398  2/1999  King et al. ............................. 257/691

FOREIGN PATENT DOCUMENTS 61-236130  10/1986  Japan .
5175406  7/1993  Japan .

*Primary Examiner*—Carl Whitehead, Jr.
*Assistant Examiner*—Roy Potter
*Attorney, Agent, or Firm*—Antonelli, Terry, Stout & Kraus, LLP

[57] ABSTRACT

Disclosed is a packaged semiconductor device, e.g., of the lead-on-chip type, having reduced thickness, by providing only an adhesive (without a base film) between inner lead portions of the leads and the semiconductor chip to adhere the inner-lead portions to the chip. The adhesive can cover a dicing area of the semiconductor chip, and, in general, can cover edge parts of the chip (and extend beyond the edge of the chip) to prevent short-circuits between the inner lead portions and the semiconductor chip. The outer lead portions have a lower outer end part and a part, closer to the package body, which extends upward obliquely; has stopper members on the obliquely extending part; and has an obliquely extending part with a greater width than a width of the outer end parts of the outer lead portions, to facilitate stacking of packaged semiconductor chips on each other, e.g., for mounting on a printed circuit board. Packaged semiconductor chips having, e.g., outer lead portions with a part that extends upward obliquely, can be mounted on opposed sides of a printed circuit board while facing in the same direction, thereby simplifying wiring of the device.

36 Claims, 32 Drawing Sheets

SEMICONDUCTOR DEVICE HAVING ADHESIVE BETWEEN LEAD AND CHIP

BACKGROUND OF THE INVENTION

The present invention relates to a semiconductor device, and more particularly to a technology suitably applied to a semiconductor device having a package of a lead-on-chip (LOC) structure in which inner lead portions of leads are arranged on a major surface of a semiconductor chip sealed in a package body.

Among surface mount LSI (large-scale integrated circuit) packages, there is an LOC-structured package. This package has inner lead portions of leads arranged through an adhesive tape (i.e., adhesive and insulating sheet, the insulating sheet also being known as a base film) on a major surface (device-forming surface) of a semiconductor chip encapsulated with a molding resin, with the inner lead portions electrically connected to bonding pads of the semiconductor chip with Au wires. Packages of this kind of LOC structure are described in Japanese Patent Laid-Open No. 218139/1986 (which corresponds to U.S. Pat. No. 4,943,843) or No. 236130/1986, etc.

A technology for memory module stacking memory devices has been under study in recent years, to meet the demands for large-capacity memories (RAMs: random access memories), as engineering workstations and personal computers that are becoming smaller in size are required to process an increasingly large volume of data at high speed.

A known example of the stacked memory module has a structure in which several thin LSI packages such as TSOPs (thin small outline packages) and TSOJs (thin small outline J-lead packages) are stacked, and the corresponding leads of the upper and lower packages are connected by solder. Japanese Patent Laid-Open No. 175406-1993 describes a technology that facilitates stacking of leads of upper and lower packages by bending upward intermediate portions of leads of a TSOJ and extending part of that bent portion of the leads horizontally.

SUMMARY OF THE INVENTION

In the LOC-structured package described above, the base film of the adhesive tape, of, e.g., an insulating sheet, interposed between the semiconductor chip and the inner lead portions, has a thickness of about 50 μm, which is one of the factors hindering reduction in the thickness of the package.

When producing a stacked memory module using the LOC-structured packages, too, the base film is an obstruction to reduction of the thickness of the module.

Further, because the base film occupies a relatively large area in the package, reflow cracks may develop in the molding resin since the base film absorbs moisture.

An object of this invention is to provide a technology that contributes to reduction in the thickness of semiconductor devices, including the LOC-structured package.

Another object of this invention is to provide a technology for lowering the cost of manufacturing semiconductor devices, including LOC-structured packages.

A further object of this invention is to provide a technology for improving the reliability and manufacturing yield of semiconductor devices, including LOC-structured packages.

A further object of this invention is to provide a technology that contributes to reduction in the thickness of stacked memory modules, including those using LOC-structured packages.

These and other objects and novel features of this invention will become apparent from the following description in this specification and the accompanying drawings. Representative aspects of this invention disclosed in this specification may be briefly summarized as follows. These representative aspects, while illustrative of the present invention, are not limiting of the scope thereof, the present invention being defined by the appended claims.

The semiconductor device of this invention is illustrated by a LOC-structured package in which inner lead portions of leads are arranged on a major surface of the semiconductor chip sealed in a package body, and the inner lead portions are, e.g., electrically connected through wires to bonding pads formed on the major surface of the semiconductor chip and are bonded to the major surface of the semiconductor chip with a non-conductive adhesive. A layer of the non-conductive adhesive is used, by itself, without also using an insulating base film (e.g., without also using a sheet of an insulating, non-adhesive material). Thus, according to the present invention, a single adhesive layer (which may have a plurality of adhesive films, or may be a single adhesive film) bonds the inner lead portions to the semiconductor chip, and may be in contact with both the inner lead portions and the semiconductor chip to provide the bond. In any event, the adhesive layer does not include a base film (non-adhesive insulating film), so as to reduce the thickness of the packaged semiconductor device.

The non-conductive adhesive can be applied to regions, at specified intervals, between the major surface of the semiconductor chip and the inner lead portions.

In the semiconductor device of this invention, at least part of the adhesive is desirably applied to edge parts of the major surface of the semiconductor chip.

In the semiconductor device of this invention, outer lead portions of the leads extending outward from sides of the package body are bent so that the package is surface-mountable, and a part of the outer leads are provided with extensions that extend upward obliquely.

The semiconductor device of this invention has a pair of stoppers that extend toward the top surface of the package body on both sides, in a width direction, of each outer lead portion of the leads extending outward from the sides of the package body.

In the semiconductor device of this invention, the width of the lower end of each outer lead portion is narrower than that of the extension that extends upward obliquely.

In the semiconductor device of this invention, dams interconnecting the outer lead portions of the lead frame are bent to form the pair of stoppers.

The semiconductor device of this invention is also, illustratively, an LOC-structured package in which inner lead portions of leads are arranged on a major surface of the semiconductor chip sealed in a package body, in which bump electrodes formed on the major surface of the semiconductor chip and the inner lead portions are electrically connected, and in which the inner lead portions are bonded to the major surface of the semiconductor chip with a non-conductive adhesive.

The semiconductor device of this invention has a multi-chip module structure in which two or more LOC-structured packages are stacked in the vertical direction on a printed circuit board (or sandwiching a printed circuit board).

DETAILED DESCRIPTION OF THE INVENTION

Now, preferred embodiments of the present invention will be described in detail referring to the accompanying drawings. These preferred embodiments are illustrative and not limiting of the present invention, the full scope of the present invention being defined by the appended claims.

Embodiment 1

Figure 1:
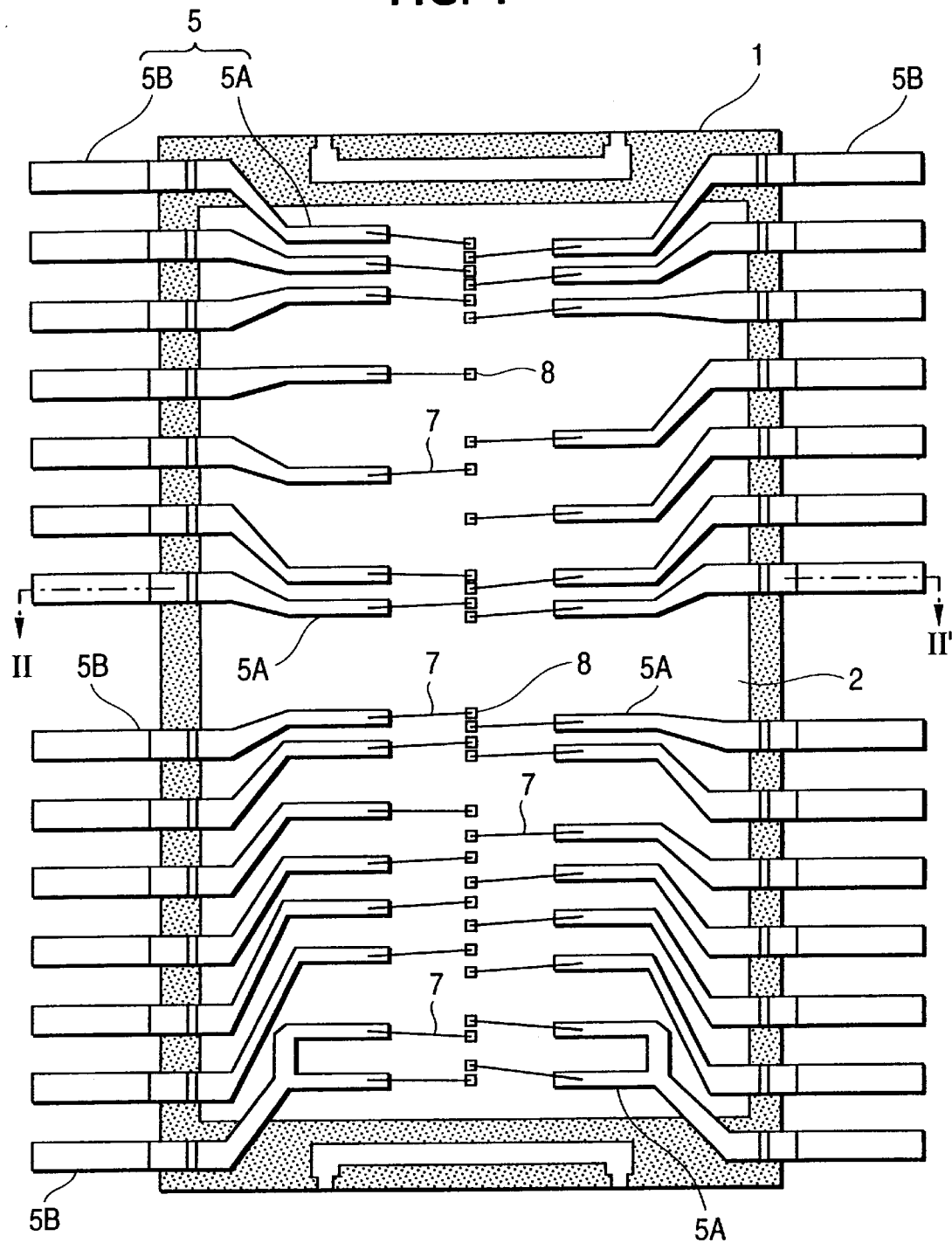
FIG. 1 is a plan view of the semiconductor device of a first embodiment of this invention.
Figure 2:
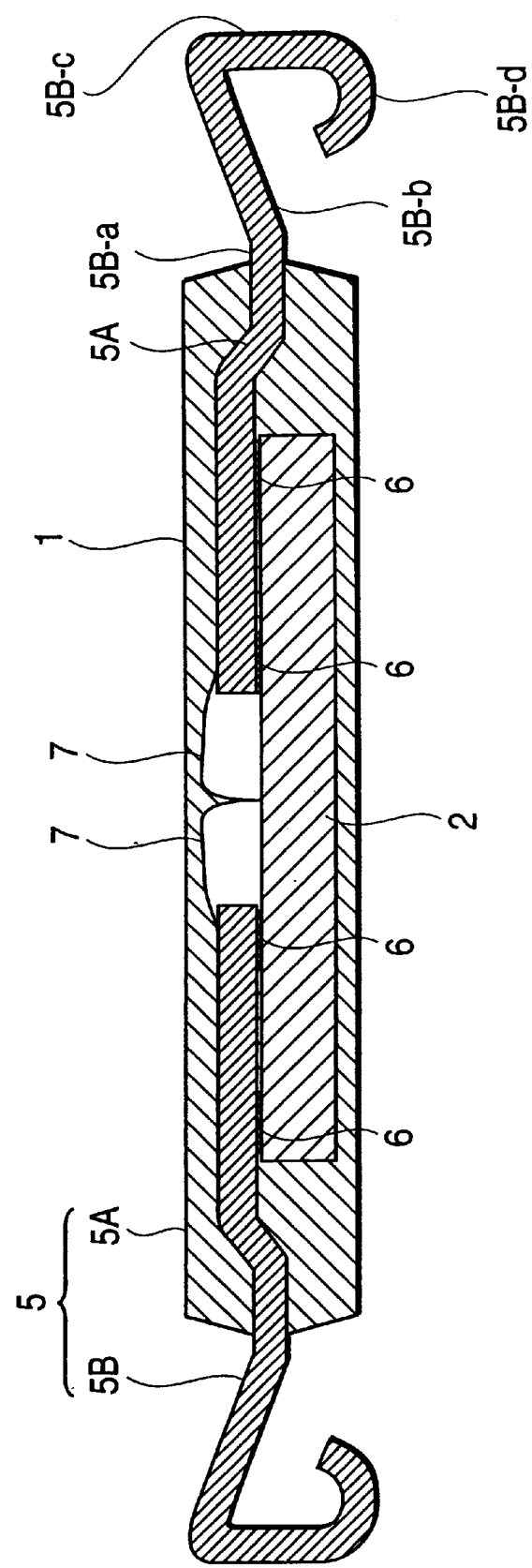
FIG. 2 is a cross section taken along the line II—II' of FIG. 1.

FIG. 1 is a plan view of the semiconductor device as the first embodiment, and FIG. 2 is a cross section taken along the line II—II' of FIG. 1. FIG. 1 does not show a part of the package body, to allow the interior structure of the package to be seen.

The semiconductor device of this embodiment is a TSOJ (thin small outline J-lead package), a kind of surface mount LSI package.

Sealed in a package body 1 of epoxy resin formed by a transfer molding method is a single crystal silicon semiconductor chip 2 on which a memory LSI such as a DRAM (dynamic random access memory) is fabricated. A plurality of leads 5 that constitute external connection terminals of the TSOJ have their inner lead portions 5A arranged on the major surface of the semiconductor chip 2. The leads 5 are made of Cu or Fe alloy and are electrically connected through Au wires 7 to bonding pads 8 formed on the central part of the major surface of the semiconductor chip 2.

As shown in FIG. 2, the inner lead portions 5A of the leads 5 are bonded to the semiconductor chip 2 with a non-conductive adhesive 6. That is, the TSOJ has the inner lead portions 5A and the semiconductor chip 2 bonded together only through the adhesive 6 without providing a thick insulating tape comprising a base film between the inner lead portions and the chip. The adhesive 6 may, for example, be a thermoplastic polyimide resin. Alternatively, and illustratively (and not limiting), the adhesive 6 may be a thermosetting epoxy resin or a thermoplastic epoxy resin.

Outer lead portions 5B of the leads 5 extend outward from the long sides of the package body 1. As shown in FIG. 2, the outer lead portions 5B each have a part (5B-a) horizontally extending from an almost central-in a thickness direction (vertically)-portion of the package body 1, an extension portion (5B-b) extending upward obliquely, a part (5B-c) extending vertically (e.g., downward), and a leading end part (5B-d) bent semicircularly. The outer lead portions 5B are thus formed into a so-called J-bend shape. The outer lead portions 5B therefore are longer in the total length than the outer lead portions of ordinary TSOJ to the extent that the outer lead portions 5B are provided with an upward oblique extension portion (5B-b).

Figure 3:
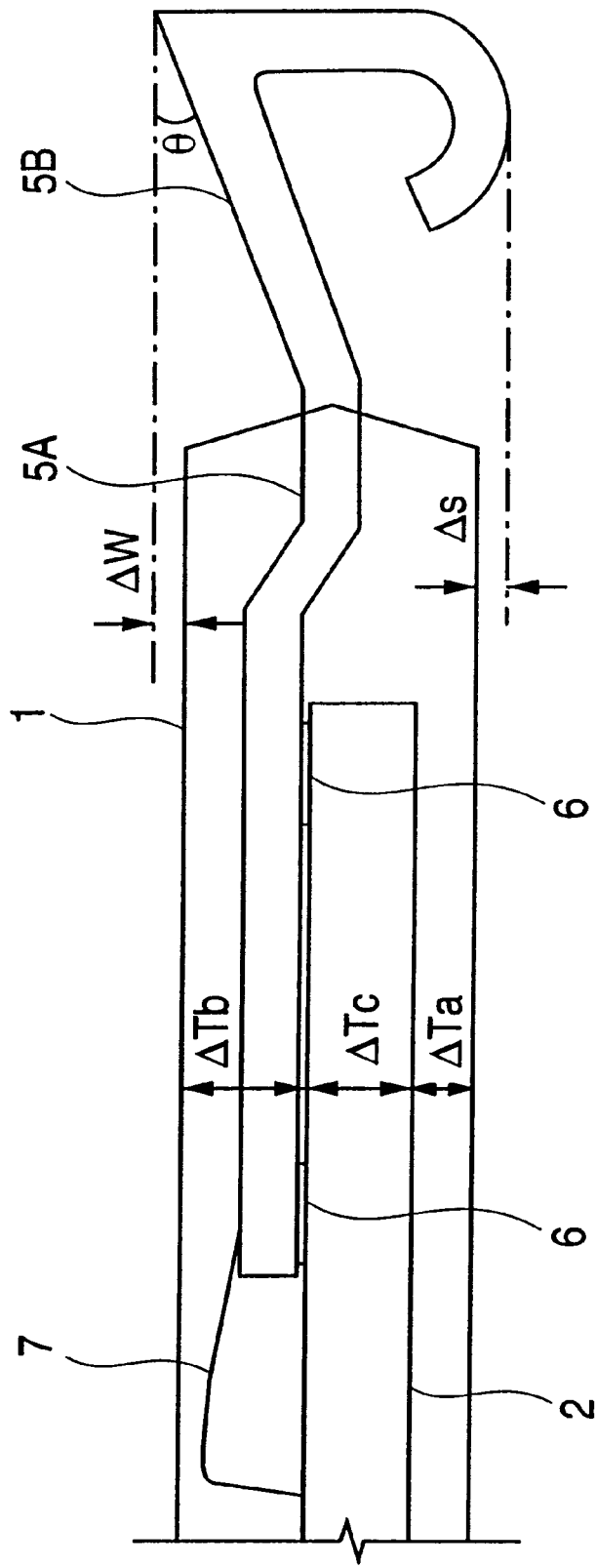
FIG. 3 is an explanatory view showing dimensions of the semiconductor device of the first embodiment of the invention.

One example of dimensions of the portions of the TSOJ measured in the thickness direction is shown in FIG. 3. These dimensions are illustrative and not limiting. The thickness of the resin from the bottom surface of the package body 1 to the underside of the semiconductor chip 2 ($\Delta$Ta) is 0.1 mm, the thickness of the semiconductor chip 2 ($\Delta$Tc)

is 0.28 mm, and the thickness of the resin from the upper surface of the semiconductor chip 2 to the upper surface of the package body 1 (ΔTb) is 0.22 mm. Thus, the thickness of the package body 1 as a whole is 0.6 mm. The thickness of the lead 5 is 0.07–0.125 mm, the thickness of the adhesive 6 is 0.01 mm, and the space between the bottom surface of the package body 1 and the lowest position of the outer lead portion 5B (Δs) is 0.03 mm. The space between the top surface of the package body 1 and the highest position of the outer lead portion 5B (Δw) is 0.03 mm. The oblique portion of outer lead portion 5B makes an angle θ with the horizontal (a direction parallel to the top surface of package body 1), with tan θ=0.35.

Figure 4:
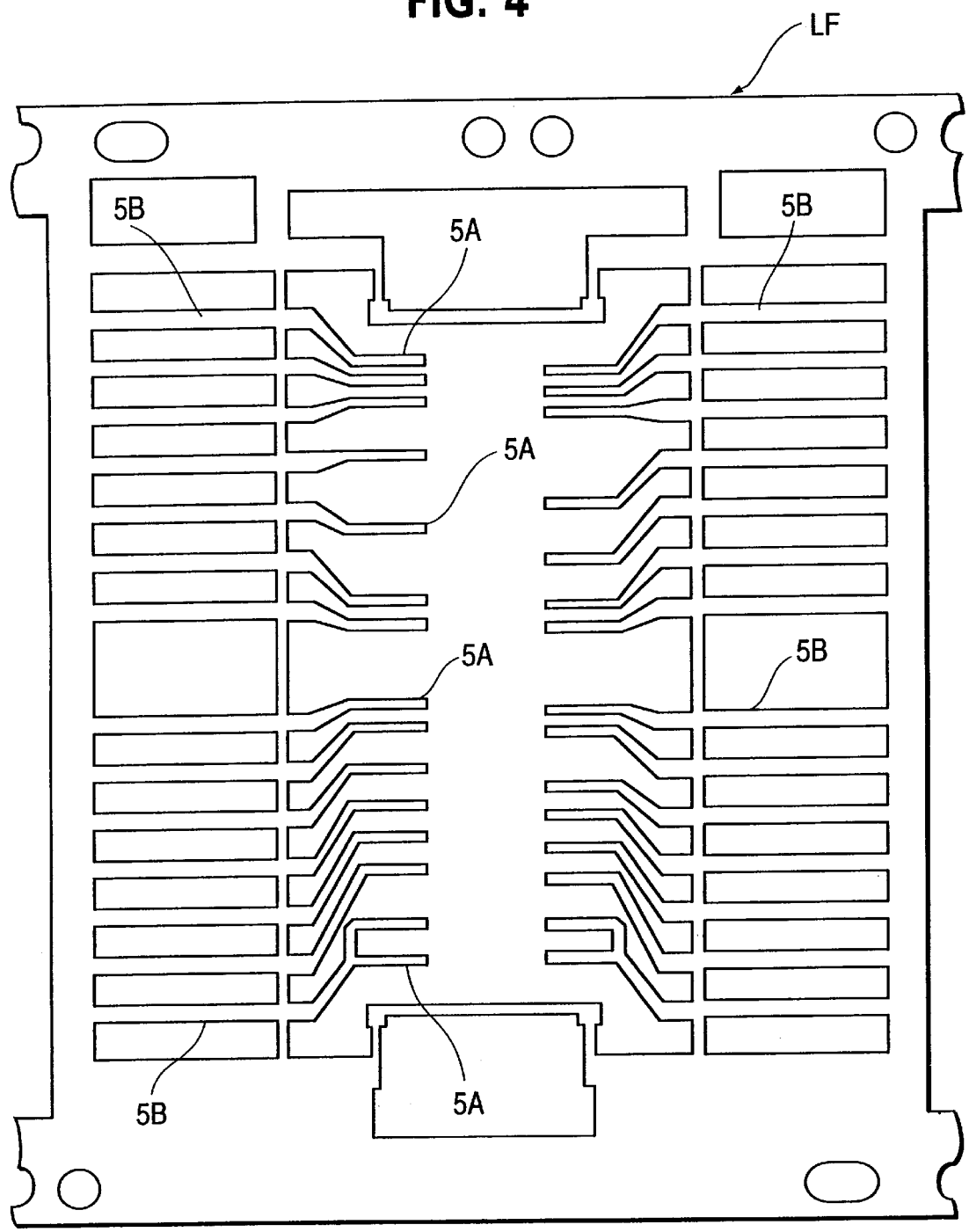
FIG. 4 is a plan view of the semiconductor device of the first embodiment, showing the process of manufacture.

To assemble the TSOJ of this embodiment, the first step is to prepare a lead frame LF shown in FIG. 4. Although the actual lead frame LF has a multiple package structure for five or six packages, the figure illustrates only the region of one package.

Figure 5:
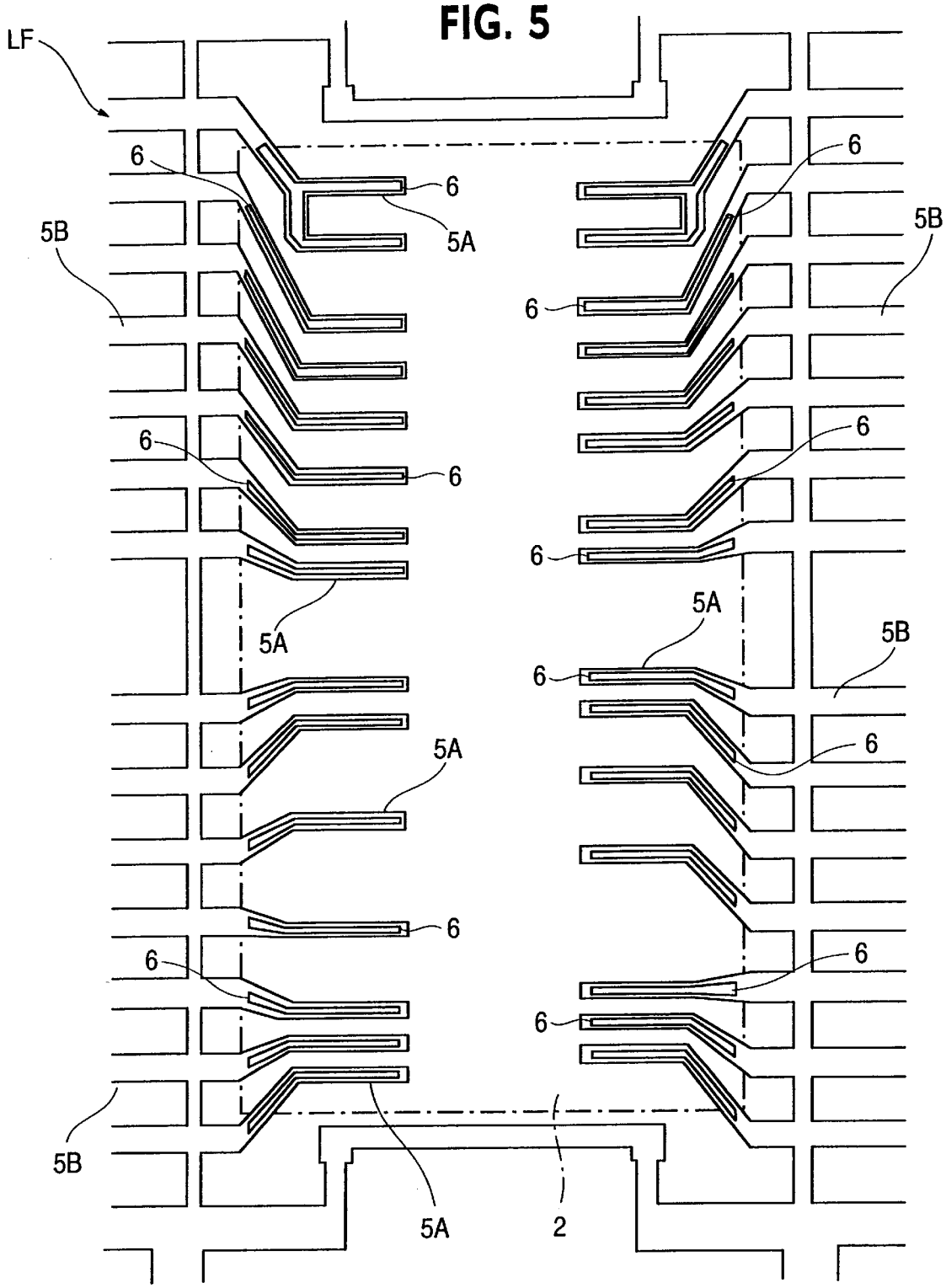
FIG. 5 is a plan view of the semiconductor device of the first embodiment, showing the process of manufacture.
Figure 6:
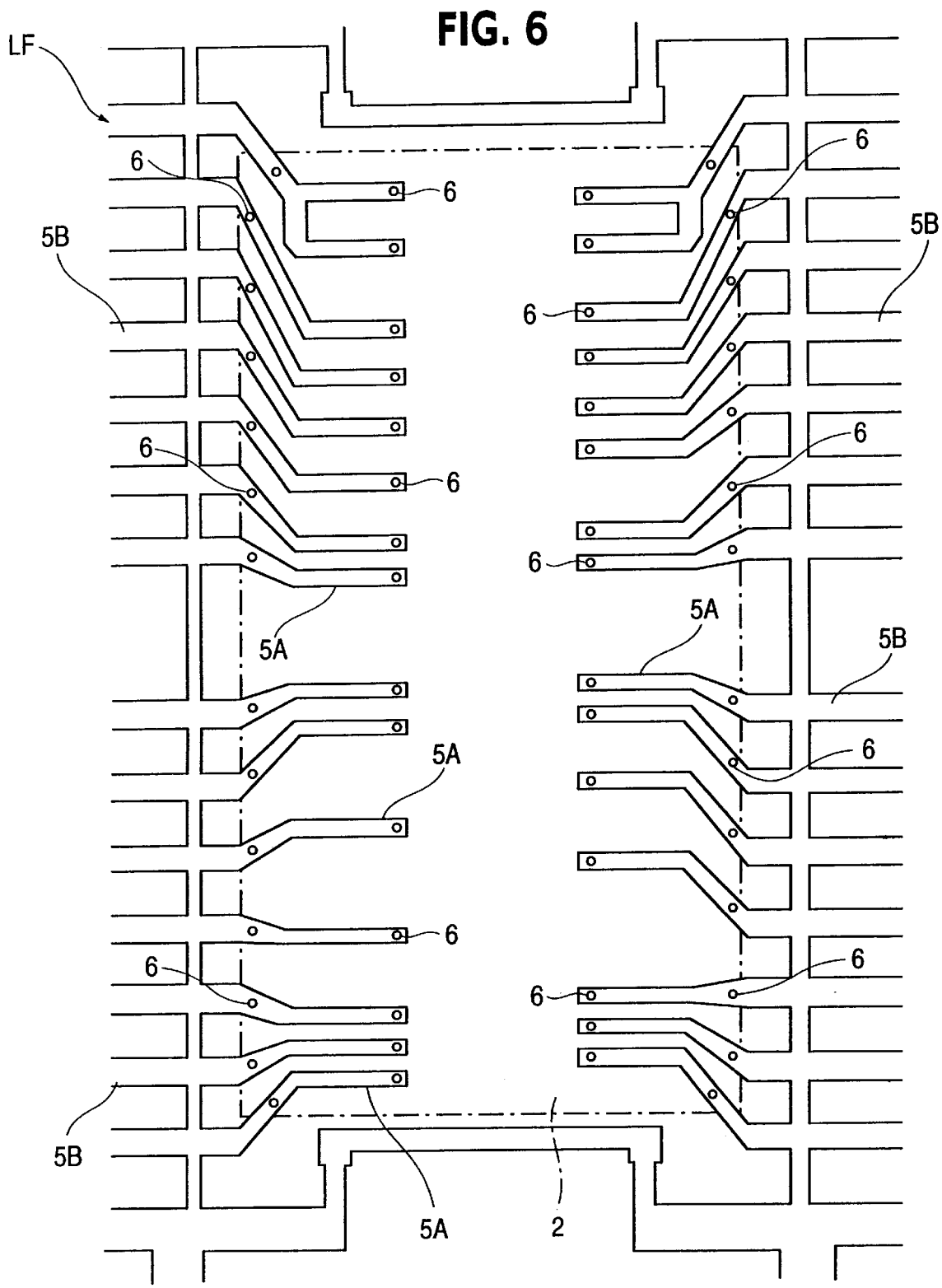
FIG. 6 is a plan view of an alternative semiconductor device of the first embodiment, showing the process of manufacture.

Next, the adhesive 6 is applied by means of a dispenser to the backs of the inner lead portions 5A of the lead frame LF. The dispenser can be a nozzle with a small opening. The adhesive 6 may be applied to the whole backs of the inner lead portions 5A, or substantially all of the whole backs of the inner lead portions as shown in FIG. 5; however, the adhesive can also be applied to two or three spots of each inner lead portion 5A, as shown in FIG. 6, to reduce the amount of adhesive 6 used and the application time. Illustratively, and not to be limiting, where the inner lead portions have a width of 0.3 mm, the spots of adhesive (e.g., centered along the mid-point of the inner lead portions) can have a diameter of 0.2 mm. The adhesive as applied can have a thickness of 10 μm; upon curing, this adhesive would have a thickness of 8 μm. Rather than using a dispenser for applying the adhesive 6, it is possible to place on the inner lead portions 5A adhesive sheets cut to precise dimensions corresponding to the inner lead portions 5A. Desirably, the adhesive has a length of at least 100 μm at the edge of the chip, in the direction the inner lead portions extend, to provide an alignment margin between the chip and the inner lead portions (illustratively, such adhesive would extend 50 μm beyond the edge of the chip).

Figure 7:
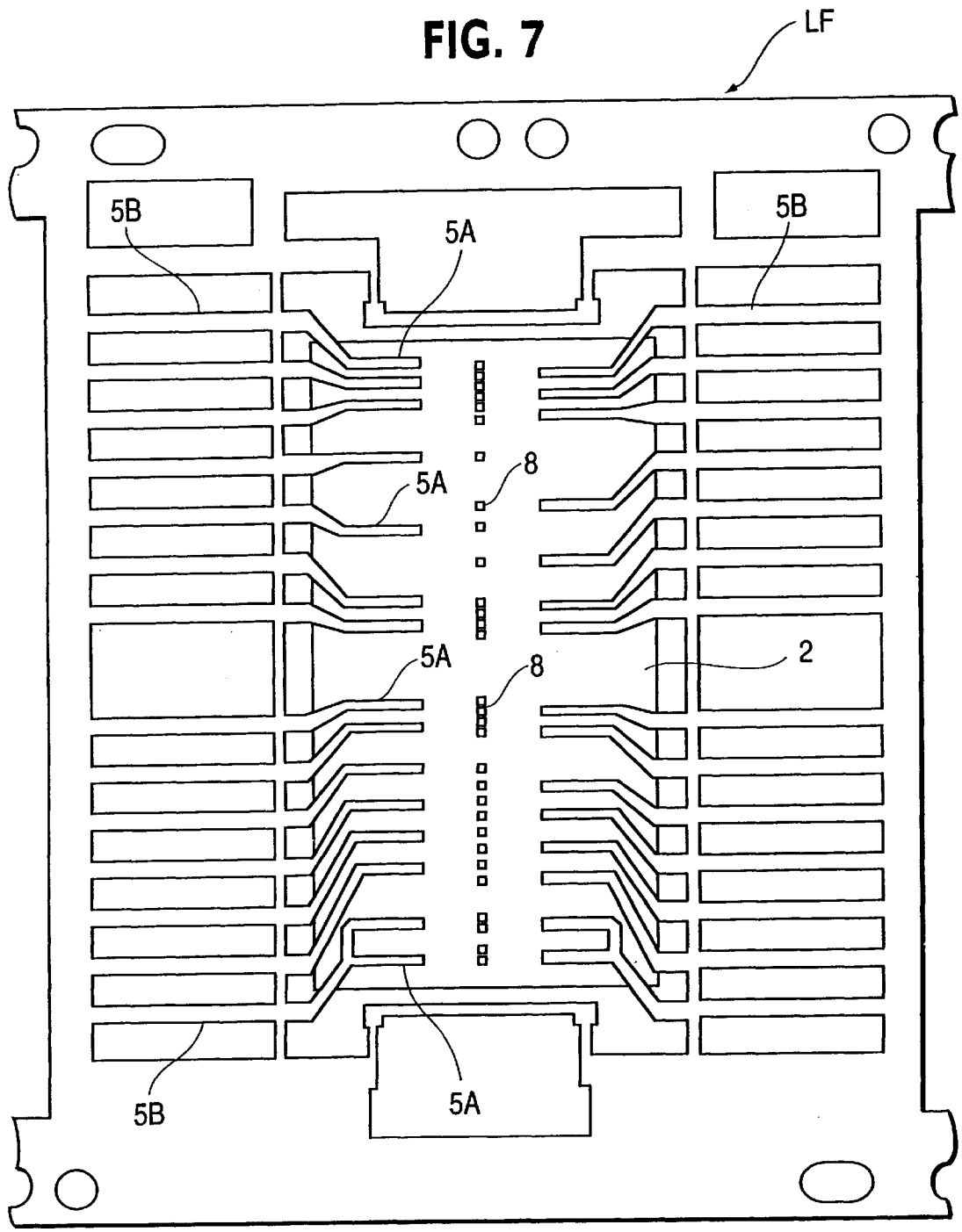
FIG. 7 is a plan view of the semiconductor device of the first embodiment, showing the process of manufacture.
Figure 8:
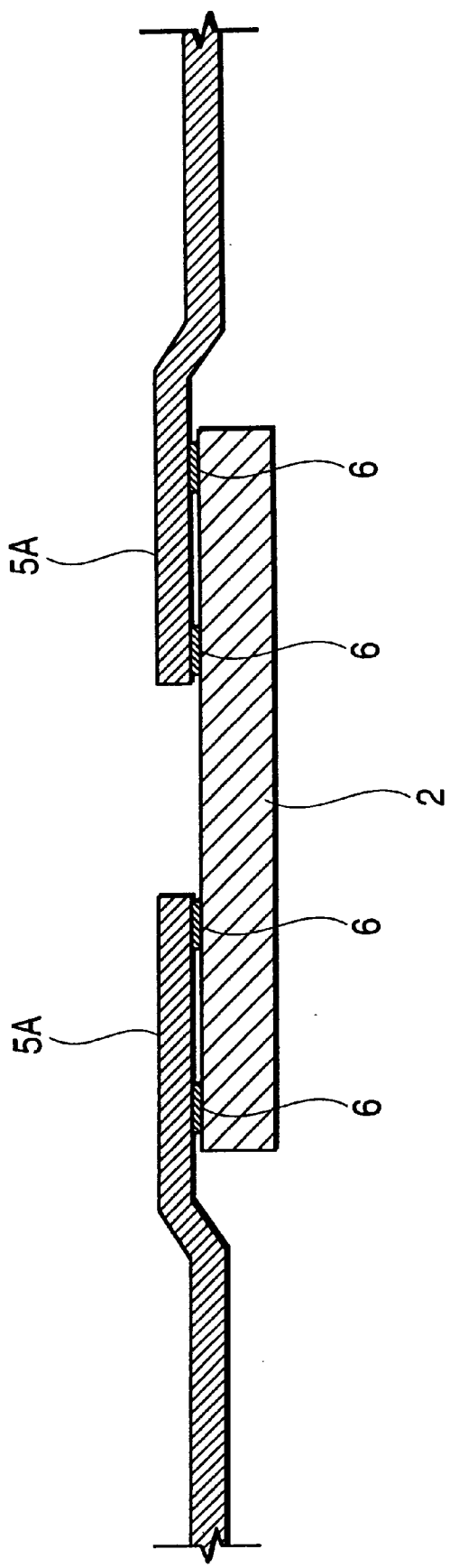
FIG. 8 is a cross section of the semiconductor device of the first embodiment, showing the process of manufacture.
Figure 9:
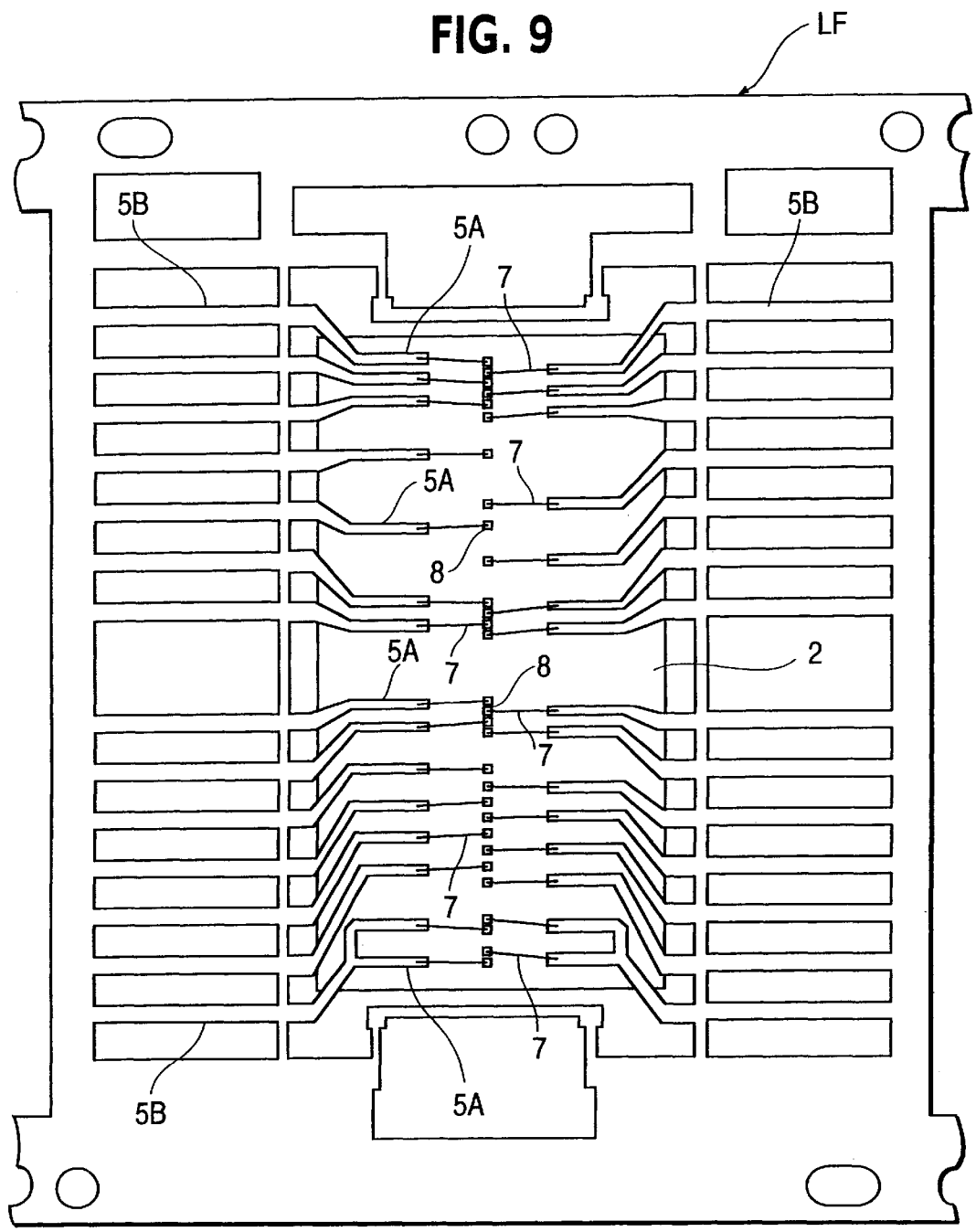
FIG. 9 is a plan view of the semiconductor device of the first embodiment, showing the process of manufacture.
Figure 10:
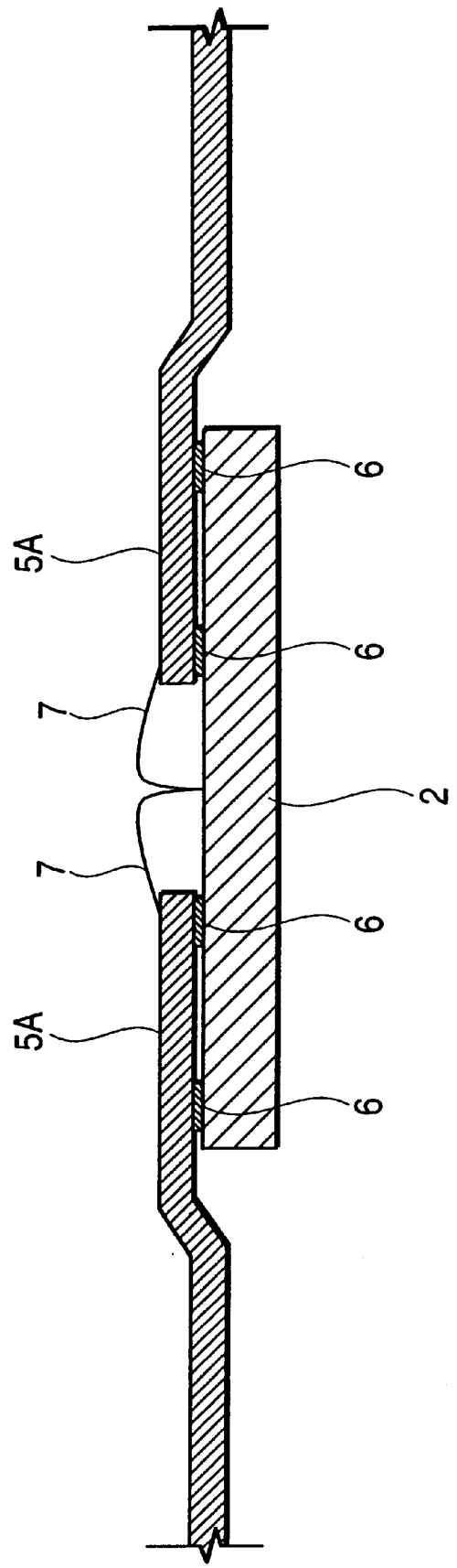
FIG. 10 is a cross section of the semiconductor device of the first embodiment, showing the process of manufacture.

Next, as shown in FIGS. 7 and 8, the inner lead portions 5A are positioned on the major surface of the semiconductor chip 2, after which the inner lead portions 5A and the semiconductor chip 2 are bonded together using the adhesive 6. Then, as shown in FIGS. 9 and 10, Au wires 7 are bonded (e.g., by thermosonic or ultrasonic bonding, known in the art) to the bonding pads 8 of the semiconductor chip 2 and to the inner lead portions 5A to electrically connect them. Preferably, the adhesive is located under the inner lead portions at the location that the wire 7 is bonded to the inner lead portion (see FIG. 29).

Figure 11:
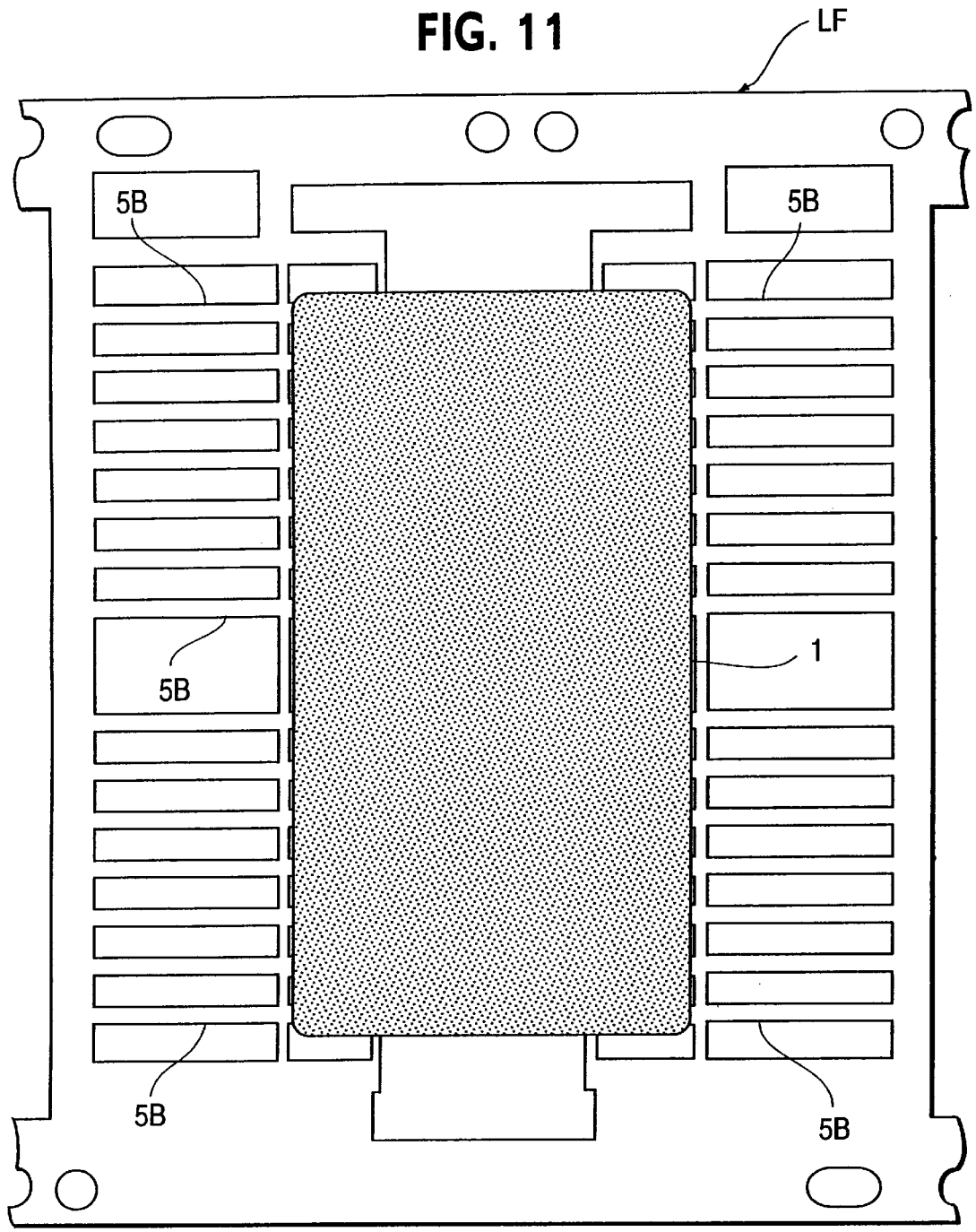
FIG. 11 is a plan view of the semiconductor device of the first embodiment, showing the process of manufacture.
Figure 12:
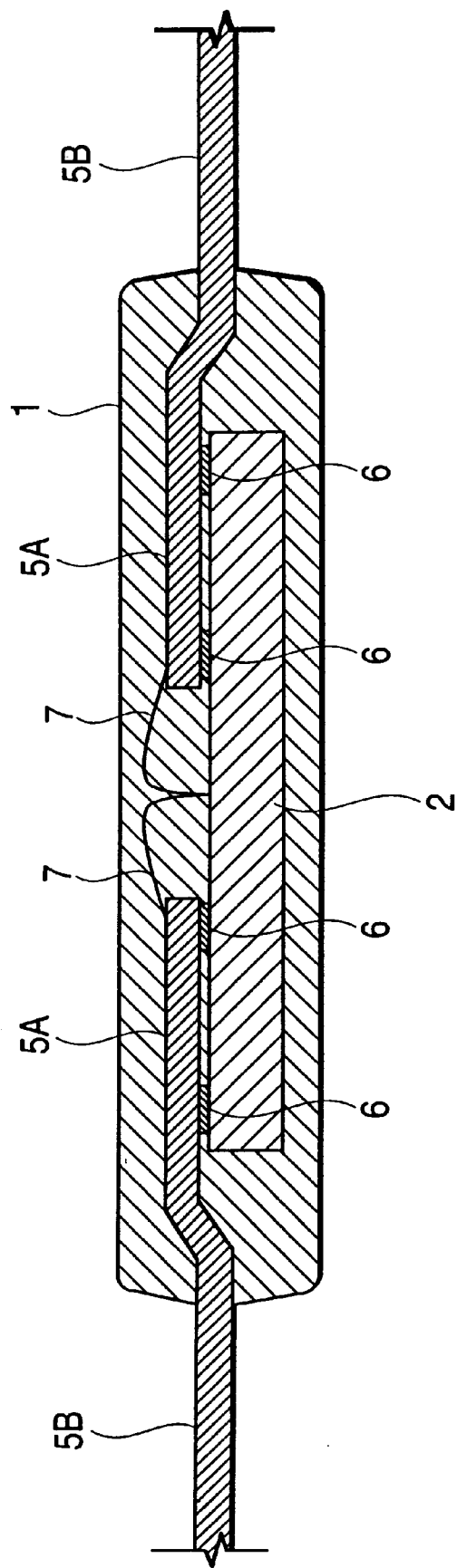
FIG. 12 is a cross section of the semiconductor device of the first embodiment, showing the process of manufacture.

Next, as shown in FIGS. 11 and 12, a package body 1 is formed by a transfer molding method, known in the art, to seal the semiconductor chip 2. Then, portions of the lead frame LF exposed from the package body 1, other than the outer lead portions 5B, are cut and removed. Then the outer lead portions 5B are shaped to complete the TSOJ shown in FIGS. 1 and 2.

Figure 13:
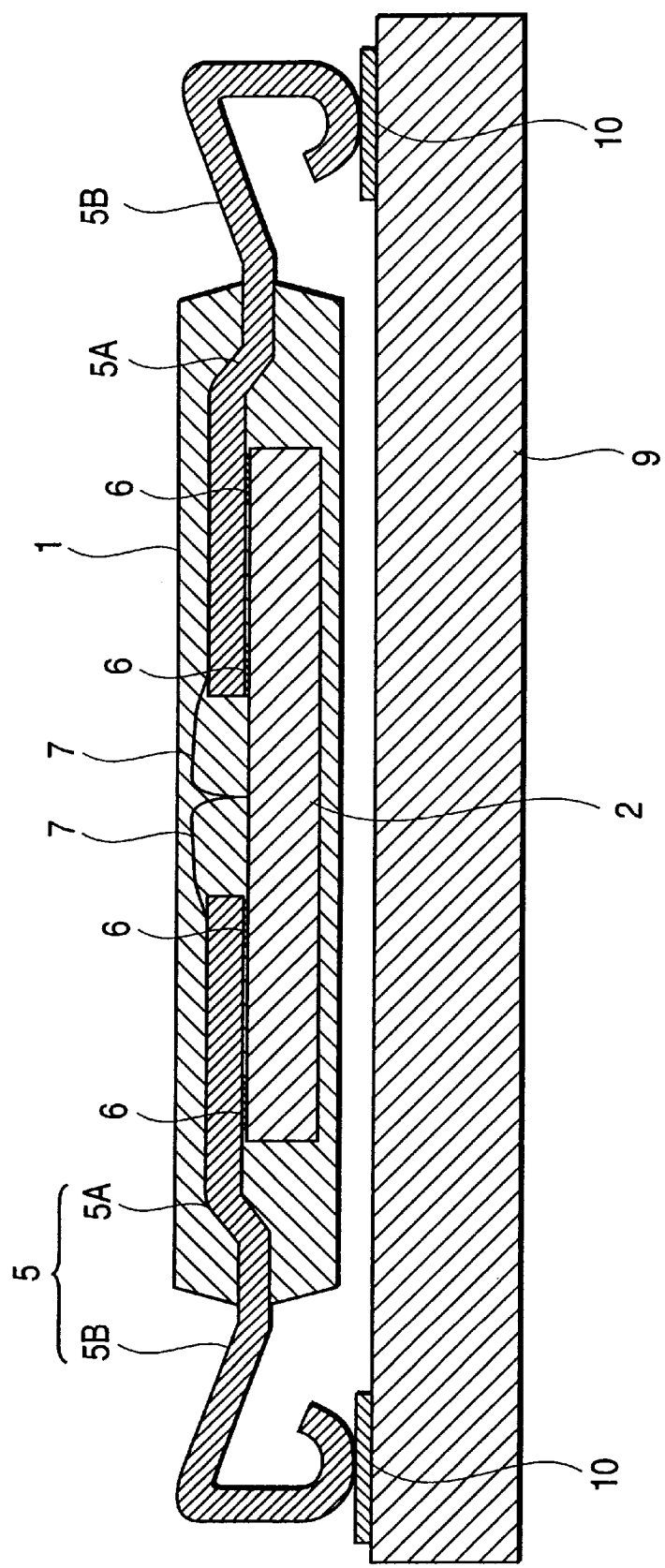
FIG. 13 is a cross section showing the semiconductor device of the first embodiment mounted on a printed circuit board.
Figure 14:
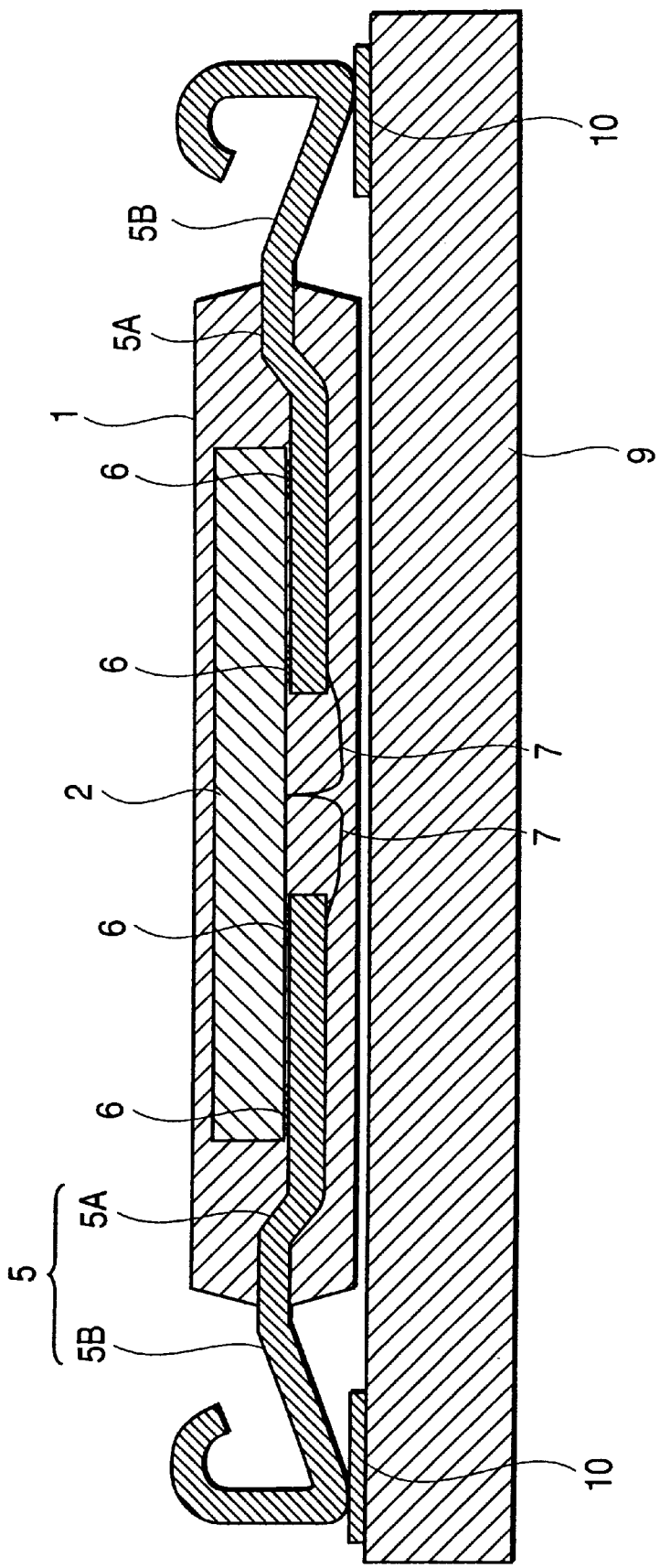
FIG. 14 is a cross section of an alternative structure of the semiconductor device of the first embodiment mounted on a printed circuit board.

FIG. 13 is a cross section showing the TSOJ of this embodiment mounted on a printed circuit board 9. To mount the TSOJ on the printed circuit board 9, the outer lead portions 5B, which are plated with solder beforehand, are positioned on electrodes 10 of the printed circuit board 9. Solder paste, known in the art, is printed on the electrodes 10 to temporarily hold the outer lead portions 5B to the electrodes 10 by the adhesive force of the solder paste. Alternatively, after the outer lead portions 5B are positioned on the electrodes 10, they may be heated to slightly melt the plating solder on the surface of the outer lead portions 5B to temporarily fix them. Referring to FIG. 14, when mounting the TSOJ on the back (underside) of the printed circuit board 9, a preliminary bonding resin is applied to the back of the printed circuit board 9 and the back of the TSOJ, and then baked to position and fix the TSOJ. In this condition, the plating solder is reflowed. In the TSOJ of this embodiment shown in FIG. 14, the package body 1 can be mounted with the face down without changing the shape of the outer lead portions 5B.

For the TSOJ of this embodiment, because the inner lead portions 5A of the leads 5 and the semiconductor chip 2 are bonded together only with the adhesive 6 without providing a base film between the leads and the chip, the thickness of the package body 1 can be reduced by a value corresponding to the thickness of the base film. The package body 1 has a thickness of 0.6 mm and thus the TSOJ of this embodiment can be accommodated in an IC card with standard thickness of 0.76 mm.

The TSOJ of this embodiment has fewer parts than the TSOJ using an insulating tape (having, e.g., an insulating (base) film with adhesive layers on both sides thereof) and hence is manufactured at a lower manufacturing cost.

Because in the case of the TSOJ of this embodiment, a base film having a relatively high moisture absorbing property is not sealed inside the package body 1, unlike the TSOJ using an insulating tape, reflow cracks do not occur easily which might otherwise be produced by heat when the TSOJ is mounted on a printed circuit board. Further, when as shown in FIG. 6 the adhesive 6 is applied to spot-like areas, the amount of moisture absorbed by the adhesive 6 can be reduced, further improving the resistance against reflow cracks.

Because the outer lead portions 5B are provided with the upward oblique extension portions, their overall length is increased, imparting an elasticity to the outer lead portions 5B. The elasticity of the outer lead portions 5B absorbs stresses produced by temperature cycles caused by soldering during mounting the package on the printed circuit board, which in turn prevents solder cracks from developing in the connections between the electrodes 10 of the printed circuit board 9 and the outer lead portions 5B.

Embodiment 2

Figure 15:
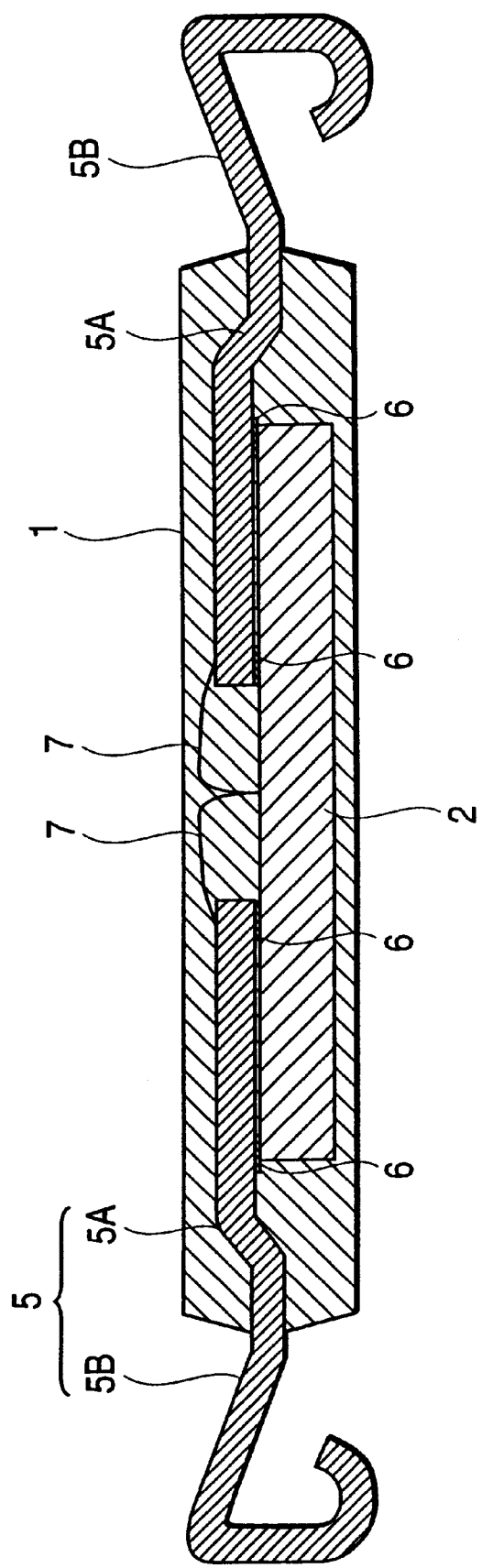
FIG. 15 is a cross section of a semiconductor device of a second embodiment of this invention.
Figure 16:
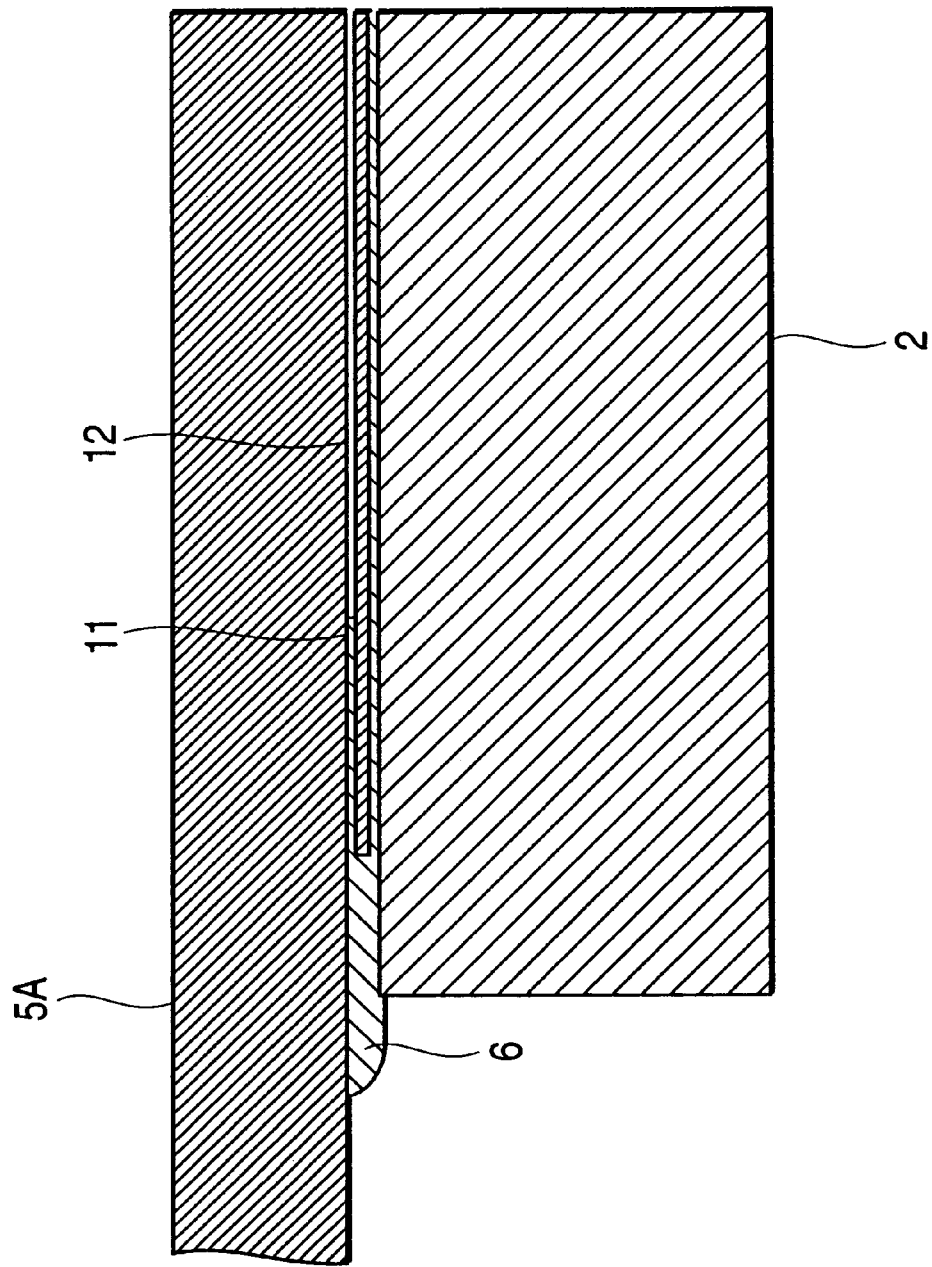
FIG. 16 is a cross section showing parts of the semiconductor device of the second embodiment.

FIG. 15 shows a cross section of a semiconductor device of this embodiment and FIG. 16 shows an enlarged cross section of a part of FIG. 15.

In the TSOJ of this embodiment, a part of the adhesive 6, that bonds together the inner lead portions 5A of the leads 5 and the semiconductor chip 2, is disposed on the edge parts of the major surface of the semiconductor chip 2.

As shown in enlarged form in FIG. 16, the major surface of the semiconductor chip 2 is ordinarily covered with a final passivation film 11 and a polyimide film 12 for protecting the integrated circuits. The final passivation film 11 (e.g., of silicon nitride or silicon oxide) is provided to prevent moisture from outside of the semiconductor chip and wiring, from contacting the chip and wiring. The polyimide film 12 is provided to prevent alpha-particles from entering into the chip, to avoid soft error, and to prevent filler (e.g., $SiO_2$) in the transfer molding resin from cracking the passivation film. To prevent cracking of the final passivation film 11 of a silicon nitride film or the alpha-ray blocking polyimide film 12 when a processed wafer is diced into semiconductor chips 2, these films are not formed at the ends of the major surface of the semiconductor chip 2 (that is, these films 11 and 12 are not provided at a dicing area, i.e., where a wafer is cut to form the semiconductor chips).

Thus, reducing the thickness of the adhesive 6 raises a risk that the lower surface of the inner lead portions 5A may contact with the edge parts of the major surface of the semiconductor chip 2, causing a short-circuit failure. Further, because the silicon substrate surface is exposed at the sides of the semiconductor chip 2, there is a possibility that the inner lead portions 5A and the semiconductor chip 2 may be short-circuited by deformed inner lead portions 5A or by conductive foreign matters present in the package.

Figure 30:
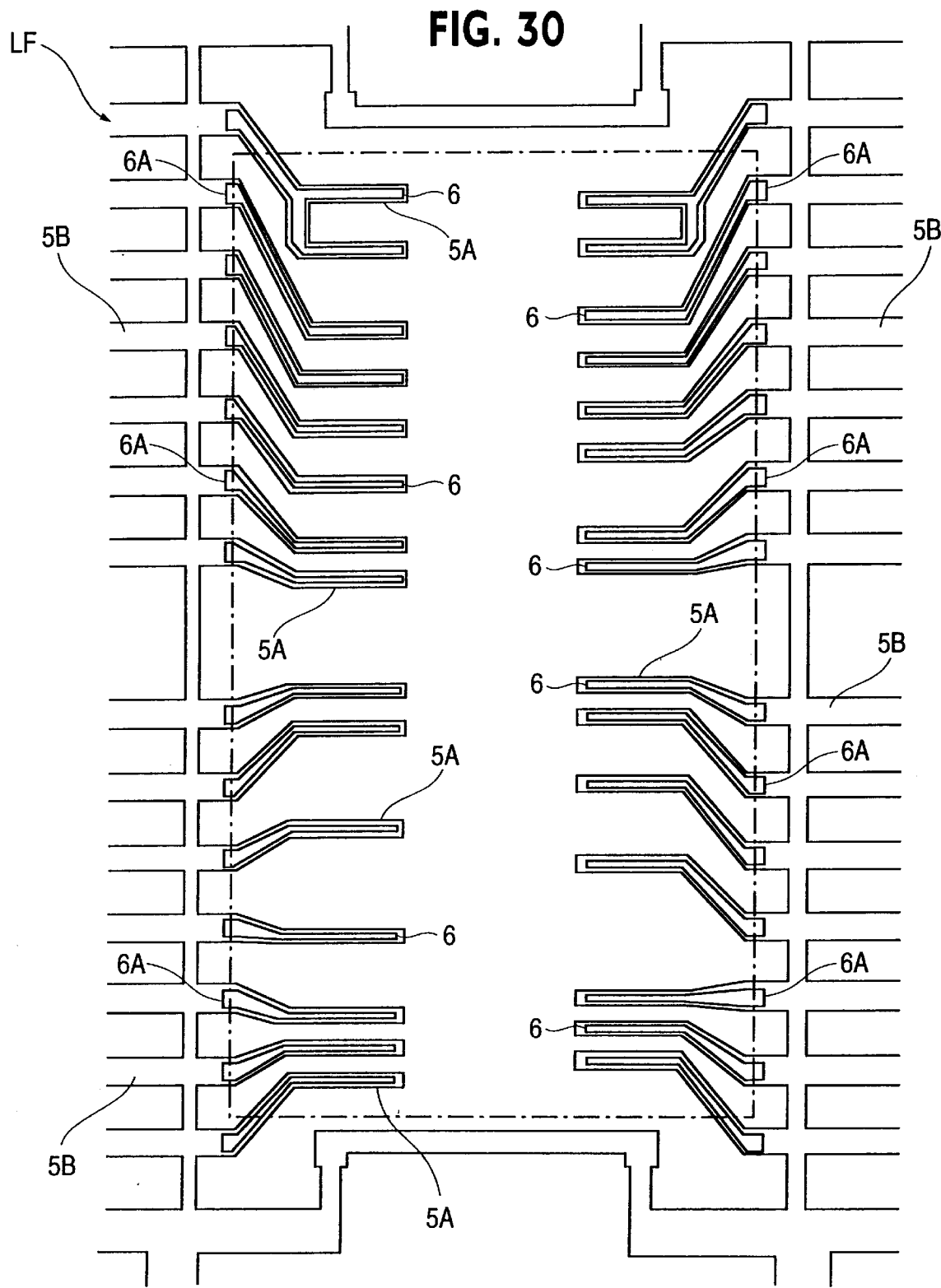
FIG. 30 is a plan view of a semiconductor device of another embodiment of the present invention.
Figure 31:
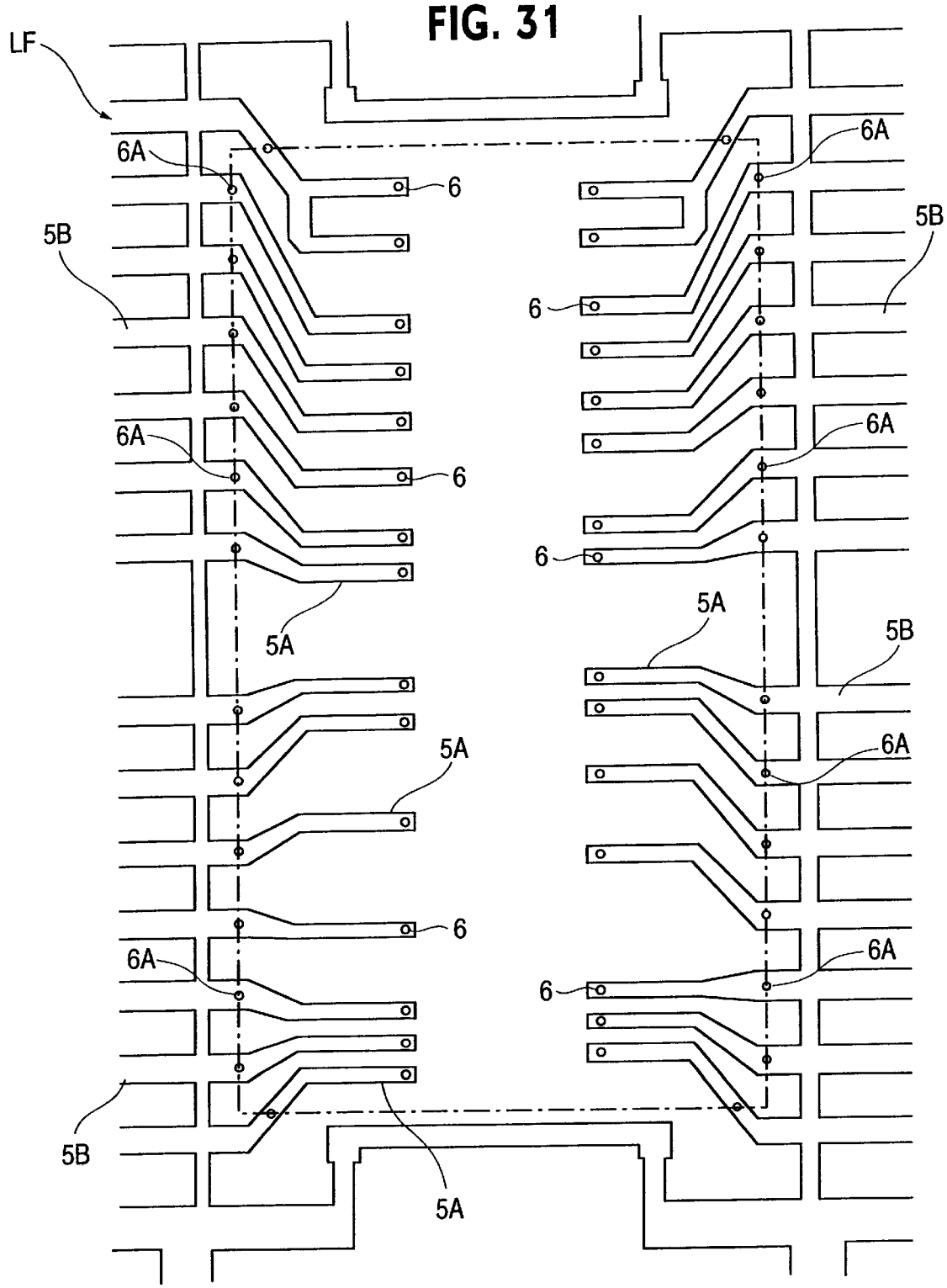
FIG. 31 is a plan view of a semiconductor device of another embodiment of the present invention.

Therefore, covering the edge parts of the major surface of the semiconductor chip 2 with the non-conductive adhesive 6 reliably prevents short-circuit failure between the inner lead portions 5A and the semiconductor chip 2 even when the thickness of the adhesive 6 is made thin. As shown in FIGS. 15 and 16, desirably the adhesive extends beyond the edge of the semiconductor chip 2; the adhesive can be provided on the leads so that when the leads are positioned on the chip the adhesive extends beyond the edge of the chip. See FIGS. 30 and 31, corresponding to FIGS. 5 and 6, respectively, but showing adhesive 6A extending beyond the chip position shown by the broken line.

Embodiment 3

Figure 17:
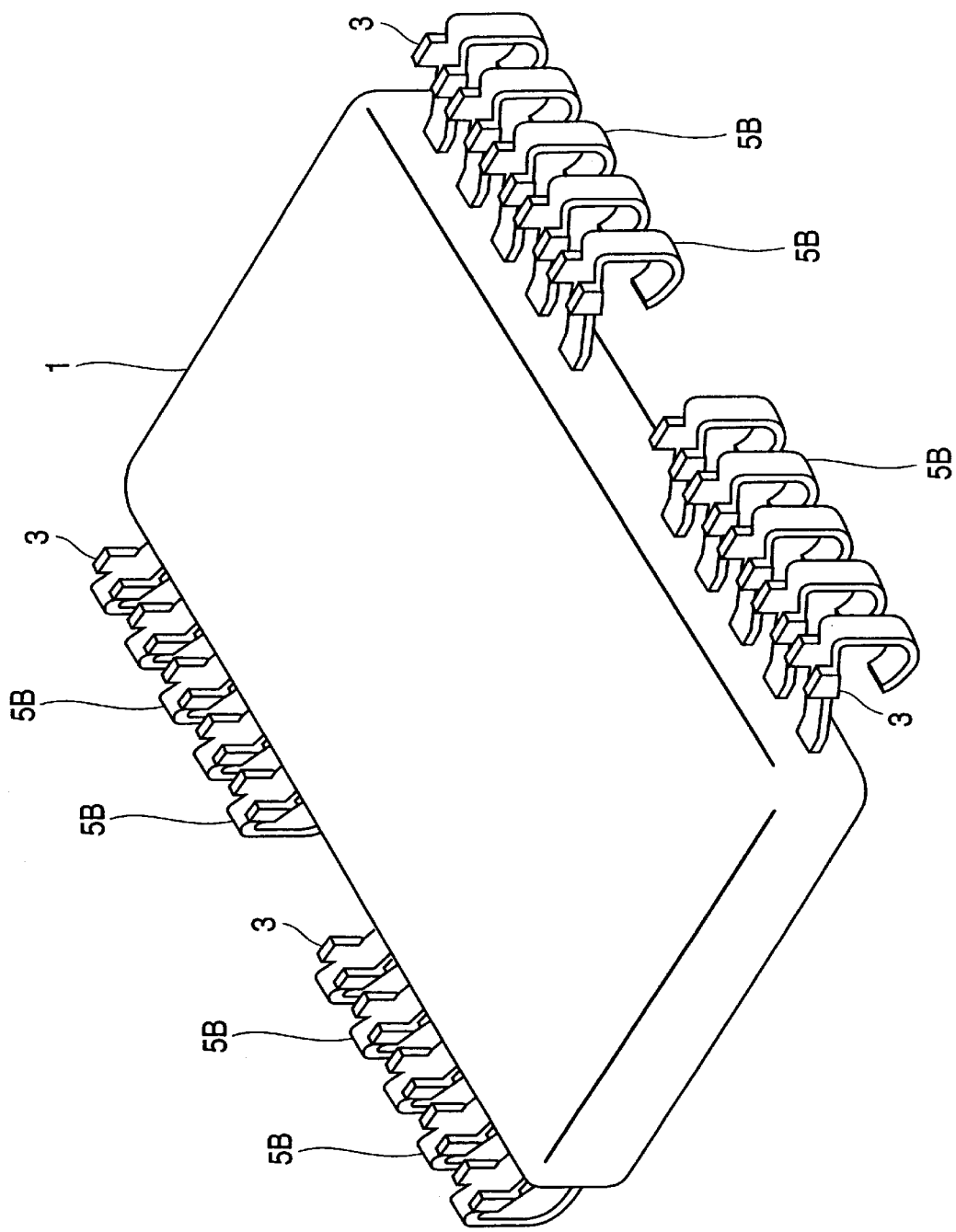
FIG. 17 is a perspective view of a semiconductor device of a third embodiment of this invention.
Figure 18:
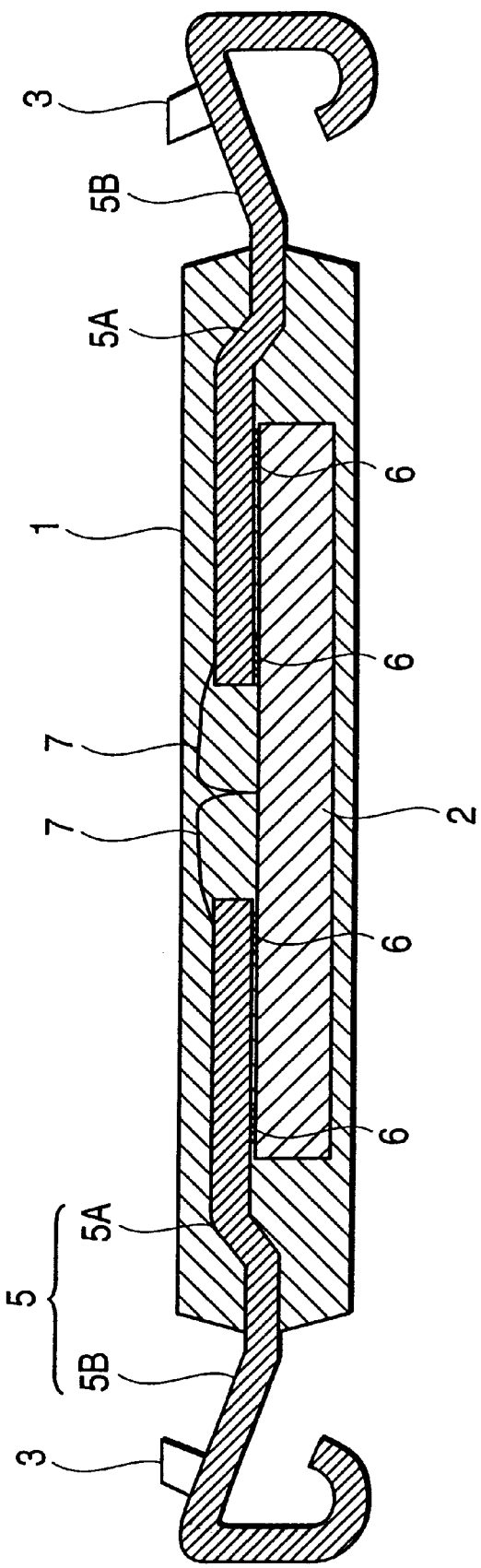
FIG. 18 is a cross section of the semiconductor device of the third embodiment.

FIG. 17 is a perspective view of a semiconductor device of this embodiment, and FIG. 18 is a cross section of this semiconductor device.

Figure 19A:
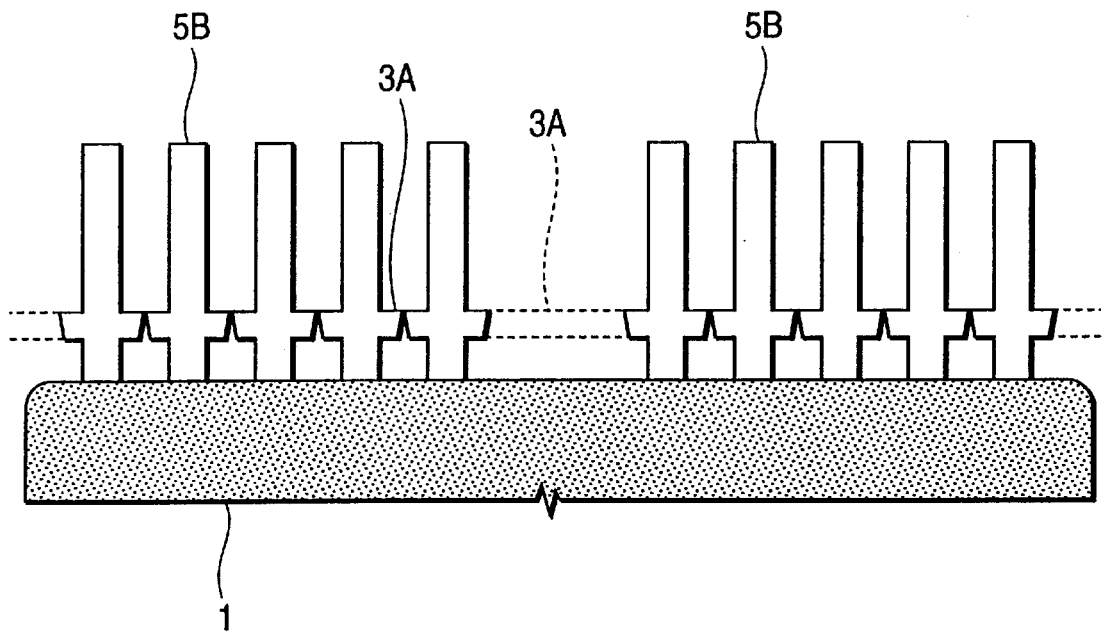
FIGS. 19(a) and 19(b) are plan views of the semiconductor device of the third embodiment, showing the process of manufacture.
Figure 19B:
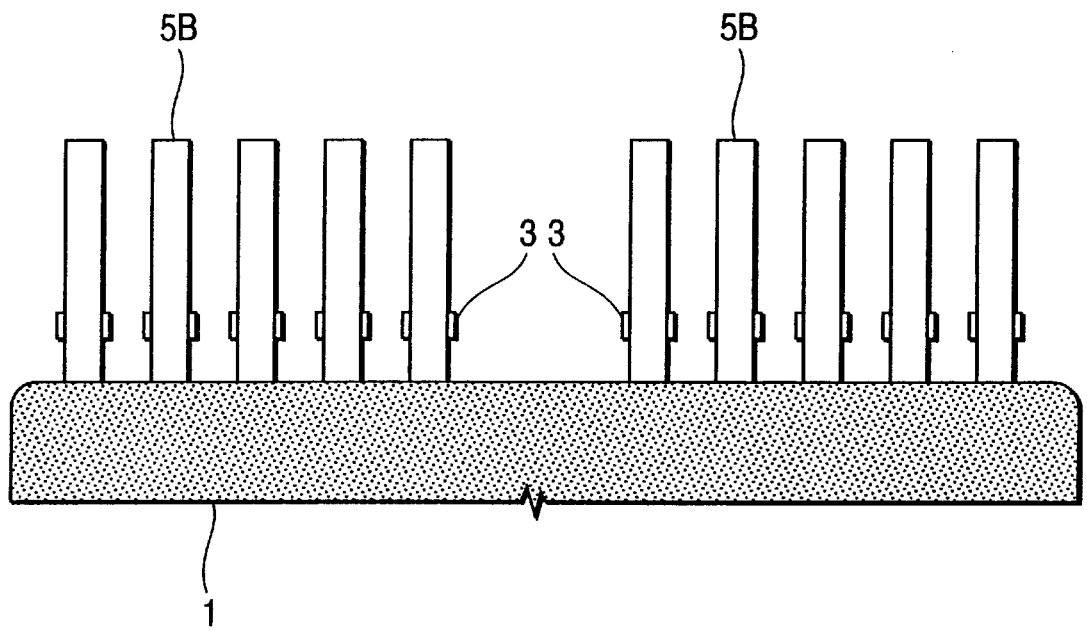

The TSOJ of this embodiment has a pair of stoppers 3, 3 that extend upward from both sides, opposed in a width direction, of each of the outer lead portions 5B of the leads 5 at the extension portion extending upward obliquely. These stoppers 3, 3, although they may be made of materials different from the leads 5, are made of the same material as the leads 5 in this embodiment. Specifically, as shown in FIG. 19(a), a dam 3A interconnecting the outer lead portions 5B is cut into a shape as shown during a lead frame cutting process after molding the package body 1. Then, as shown in FIG. 19(b), the cut dams are bent upward to form the stoppers 3. Illustratively, and not to be limiting, each of the stoppers 3 extends to a height of about 0.15–0.2 mm above the leads.

Figure 20:
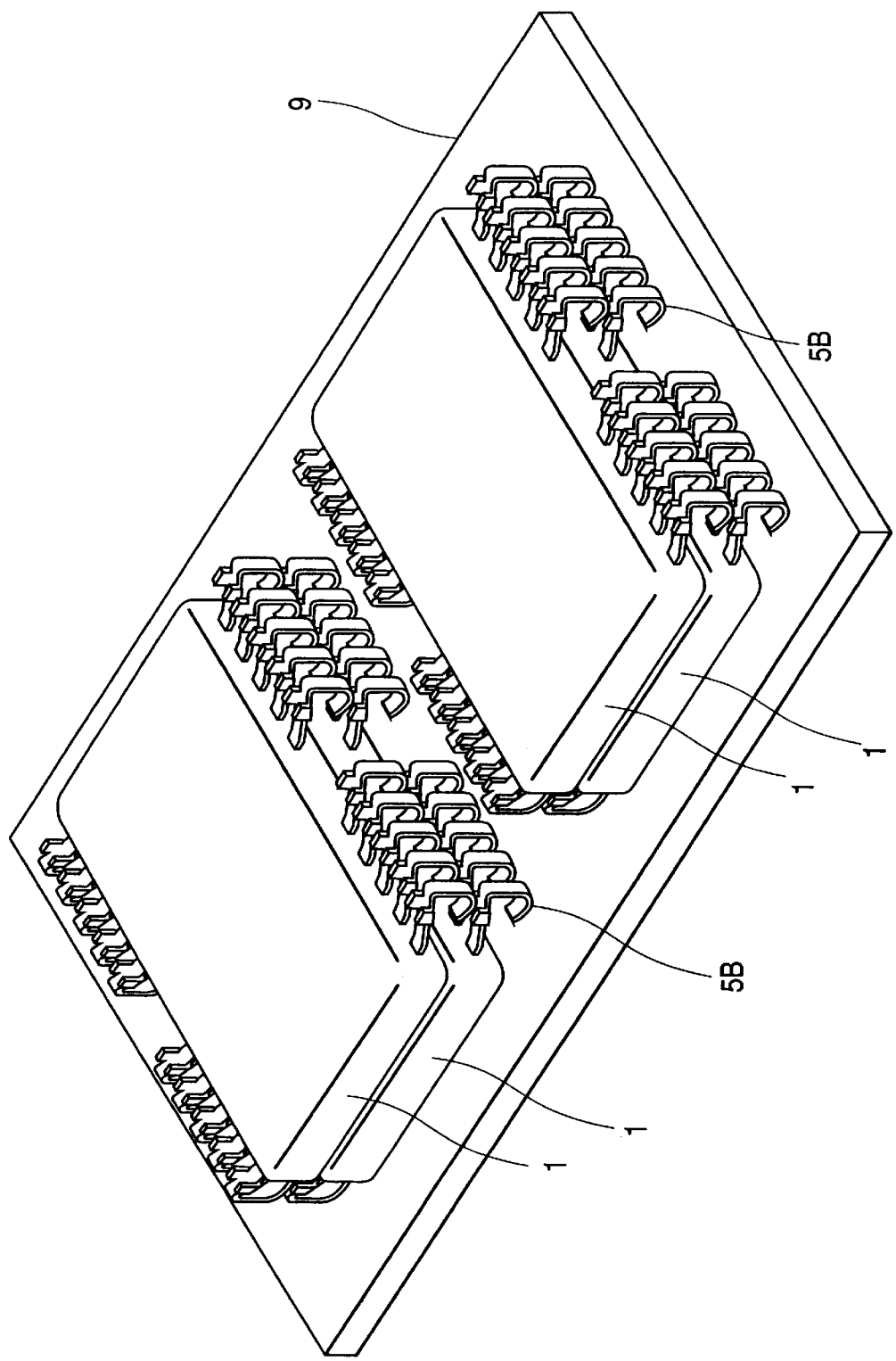
FIG. 20 is a perspective view showing an example of a stack type memory module using the semiconductor devices of the third embodiment.

FIG. 20 is a perspective view of a stacked type memory module, in which, for example, two TSOJs of this embodiment are stacked one upon the other, and two rows of such stacked packages are arranged on the printed circuit board 9. While FIG. 20 shows two stacked packages, the present invention is not limited to two in a stack, and can include more than two in a stack.

Figure 21:
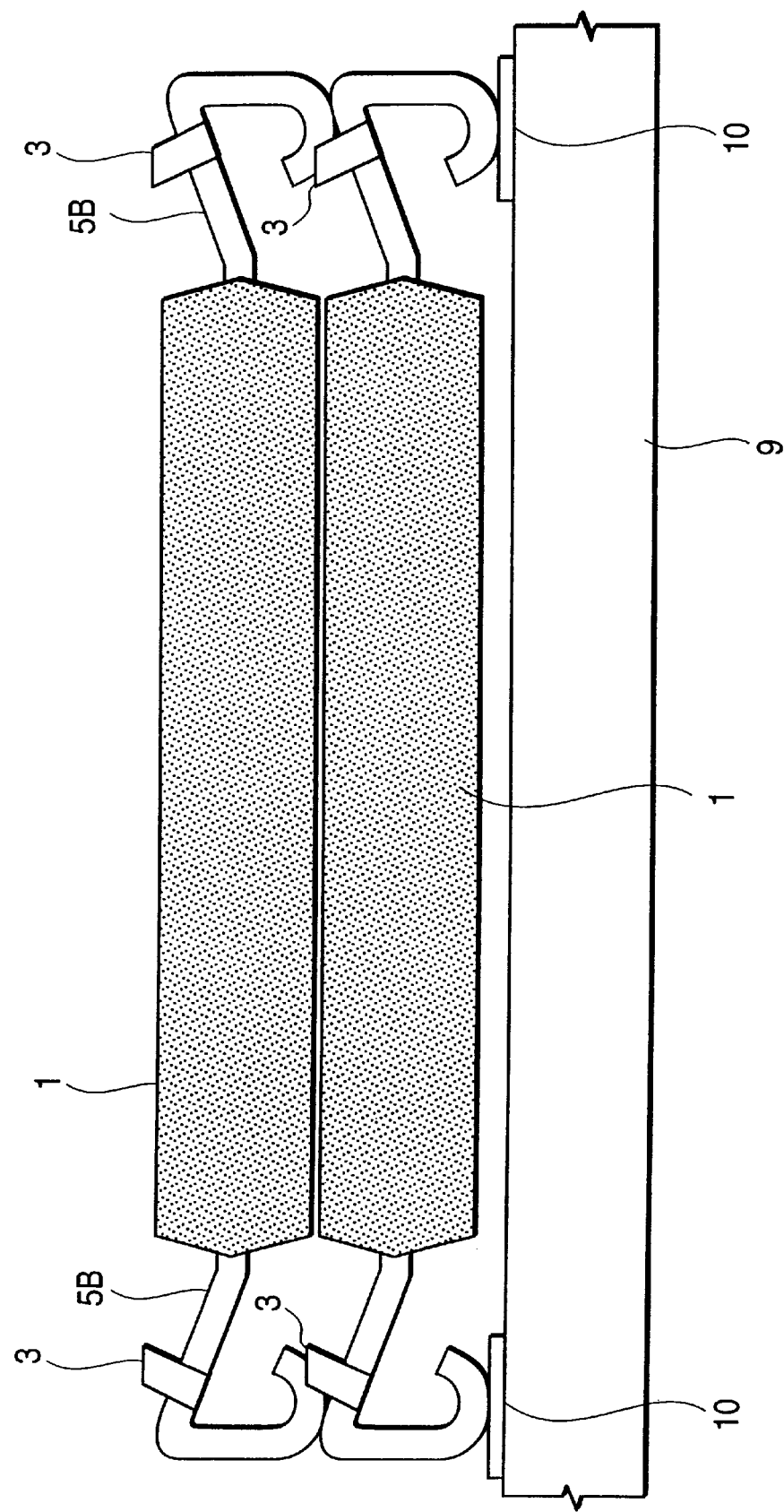
FIG. 21 is an explanatory view showing the process of manufacture of the stack type memory module using the semiconductor devices of the third embodiment.

The stack type memory module is assembled as follows. As shown in FIG. 21, a first TSOJ is mounted on the electrodes 10 of the printed circuit board 9 according to the process described before in the first embodiment, after which a second TSOJ is stacked on the first one, with the lower ends of the outer lead portions 5B of the second TSOJ positioned on the outer lead portions 5B of the first TSOJ. The lower ends of the outer lead portions 5B of the second TSOJ may be coated with solder paste beforehand so that the upper and the lower outer lead portions 5B, when stacked together, can be held together temporarily with the adhesive force of the solder paste.

Figure 22:
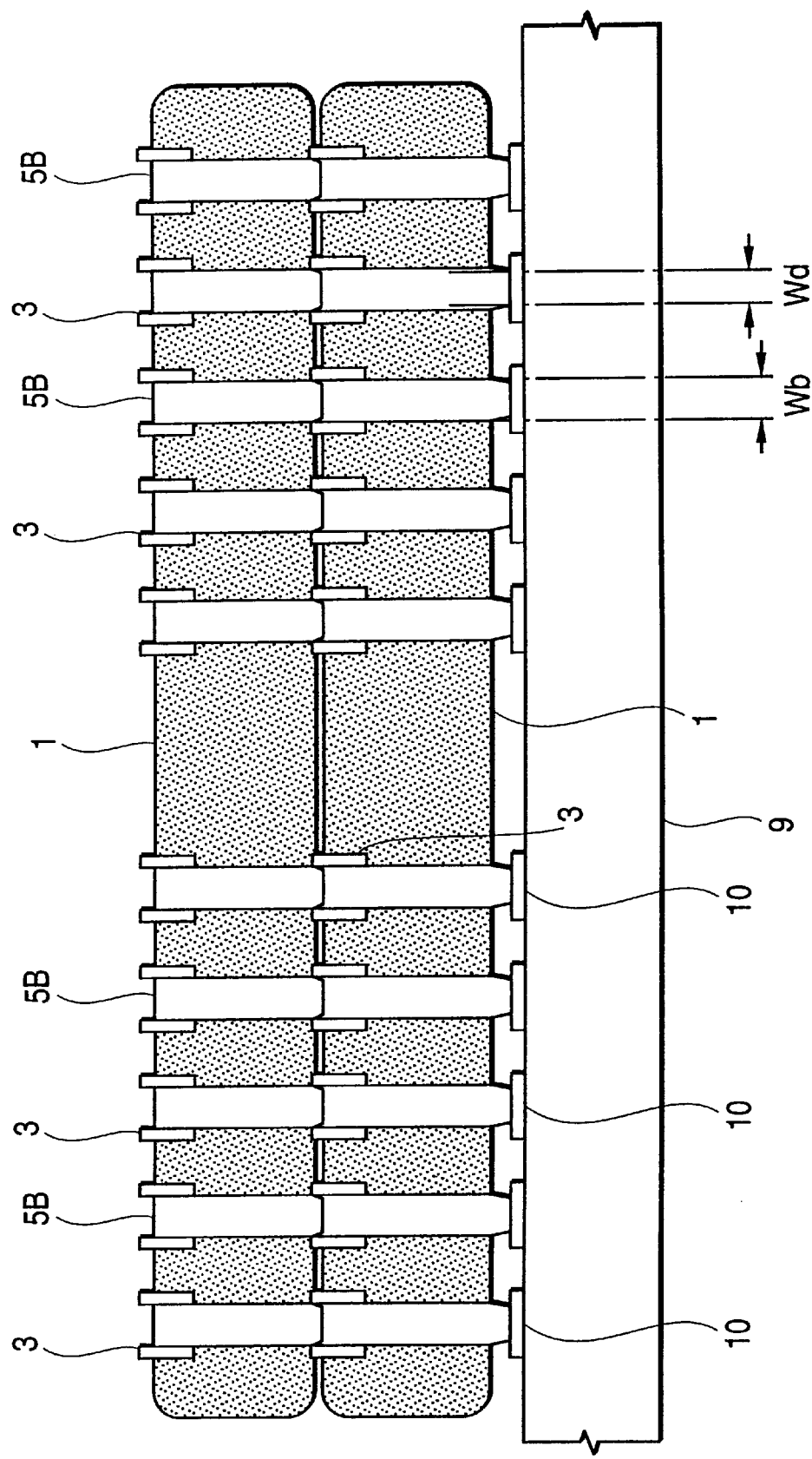
FIG. 22 is an explanatory view showing the process of manufacture of the stack type memory module using the semiconductor devices of the third embodiment.

Because in the TSOJ of this embodiment the pair of stoppers 3, 3 are provided on both sides, opposed in the width direction, of each of the outer lead portions 5B, the lower ends of the outer lead portions 5B of the second TSOJ can be positioned on the outer lead portions 5B of the first TSOJ precisely and quickly using the stoppers 3, 3 as a guide. As shown in FIG. 22, the width (Wd) of the lower end of each outer lead portion 5B, i.e., a portion bent semicircularly, is set smaller than the width of the upward oblique extension portion (Wb) (that is, Wd<Wb). This allows the lower ends of the outer lead portions 5B to be quickly inserted between the stoppers 3, 3 even when there are some deformations in the outer lead portions 5B.

Then, the printed circuit board 9 is placed on a tray and loaded into a reflow furnace where the plating solder on the surfaces of the outer lead portions 5B of the TSOJs is melted to securely connect the outer lead portions 5B of the first TSOJ to the electrodes 10 of the printed circuit board 9 and also interconnect the outer lead portions 5B of the upper and lower TSOJs.

Because the outer lead portions 5B of the second TSOJ are each inserted between the stoppers 3, 3 provided to the outer lead portions 5B of the first TSOJ, the outer lead portions 5B can be prevented from shifting in the direction of their width (in the longitudinal direction of the package body 1) due to vibrations produced when the trays carrying the printed circuit boards 9 are transferred into the reflow furnace. Further, because the lower ends of the outer lead portions 5B of the second TSOJ are situated on the upward oblique extension portions of the outer lead portions 5B of the first TSOJ, the outer lead portions 5B of the second TSOJ can be prevented from shifting in the direction in which the outer lead portions 5B extend (in a lateral direction of the package body 1), too. The stoppers 3, 3 need not be provided to all of the outer lead portions 5B extending outward from the package body 1, but may be provided to only some of the outer lead portions 5B.

In this embodiment, when stacking a plurality of TSOJs to form a stack type memory module on the printed circuit board 9, it is possible to connect the outer lead portions 5B of the upper and lower TSOJs accurately and quickly, improving the manufacturing yield and throughput of this memory module.

In this embodiment using thin TSOJs, reduction in the thickness of the stack type memory module can be promoted.

Figure 23:
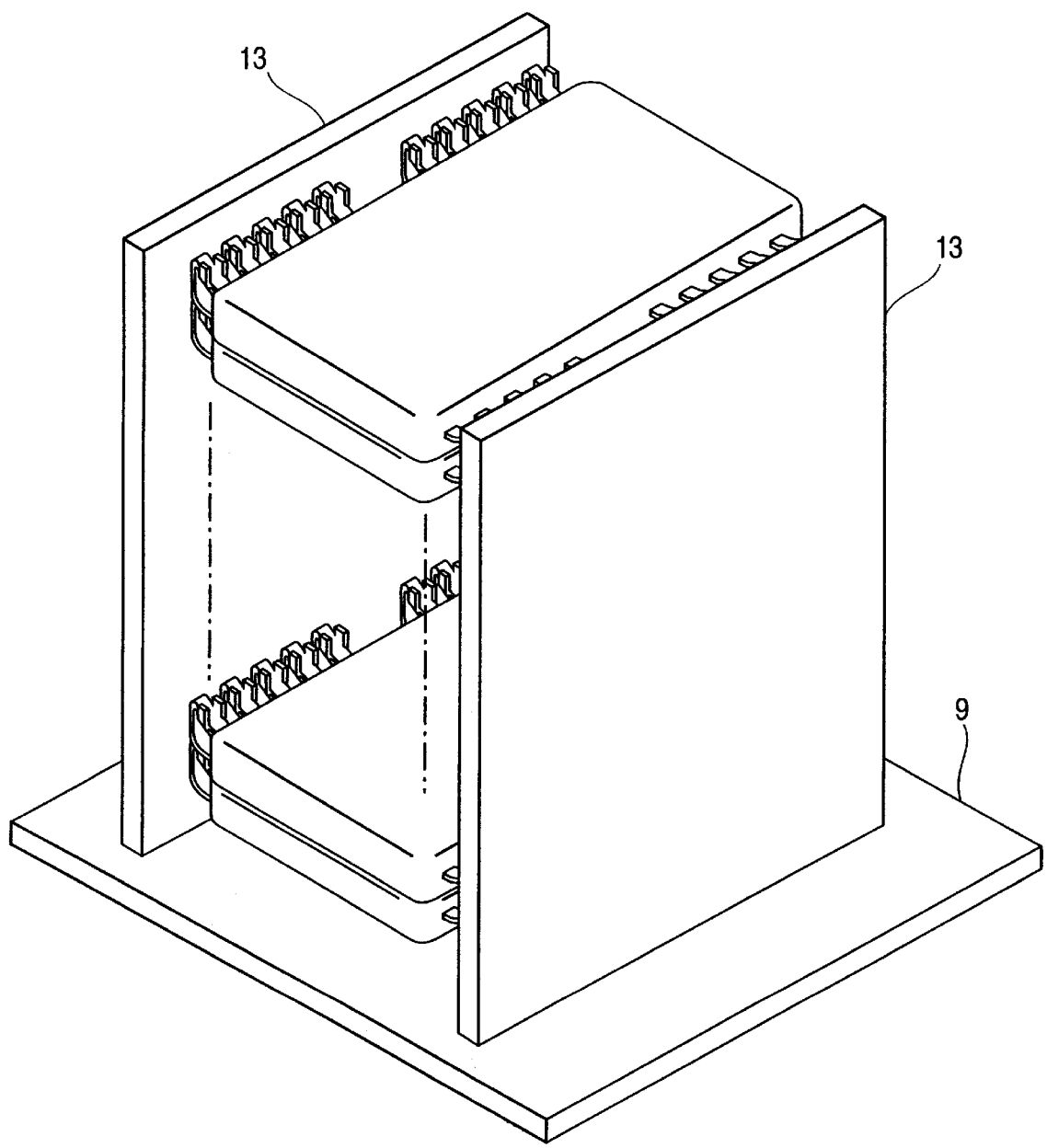
FIG. 23 is a perspective view showing another example of a stack type memory module using the semiconductor devices of the third embodiment.

It is easily understood that two or more TSOJs of this embodiment can be stacked. FIG. 23 shows one example of the stack type memory module in which a plurality of TSOJs stacked in multiple layers on the printed circuit board 9 are electrically connected to one another through a pair of printed circuit boards 13 arranged on both sides of the stacked TSOJs.

Embodiment 4

Figure 24:
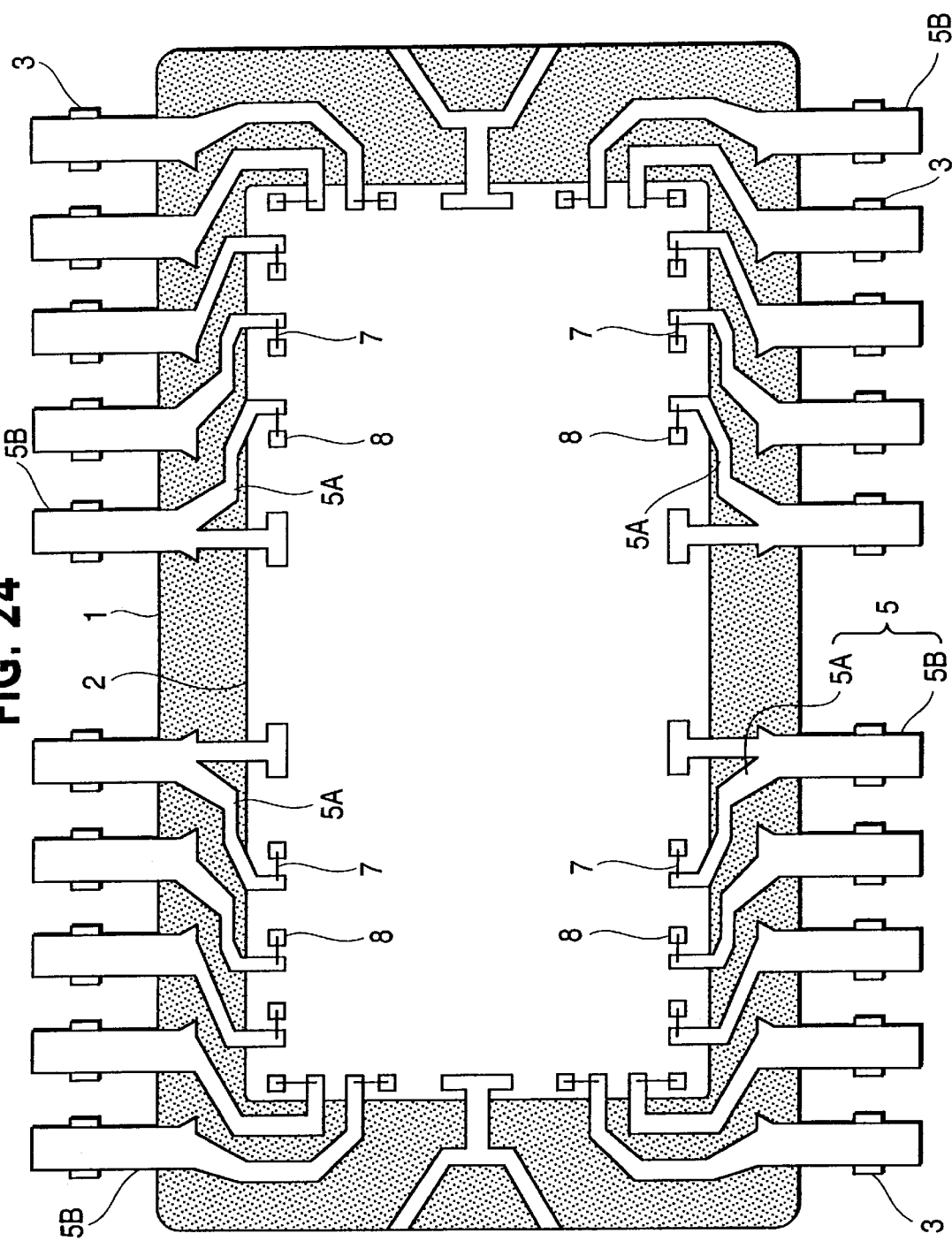
FIG. 24 is a plan view of a semiconductor device of a fourth embodiment of this invention.
Figure 25:
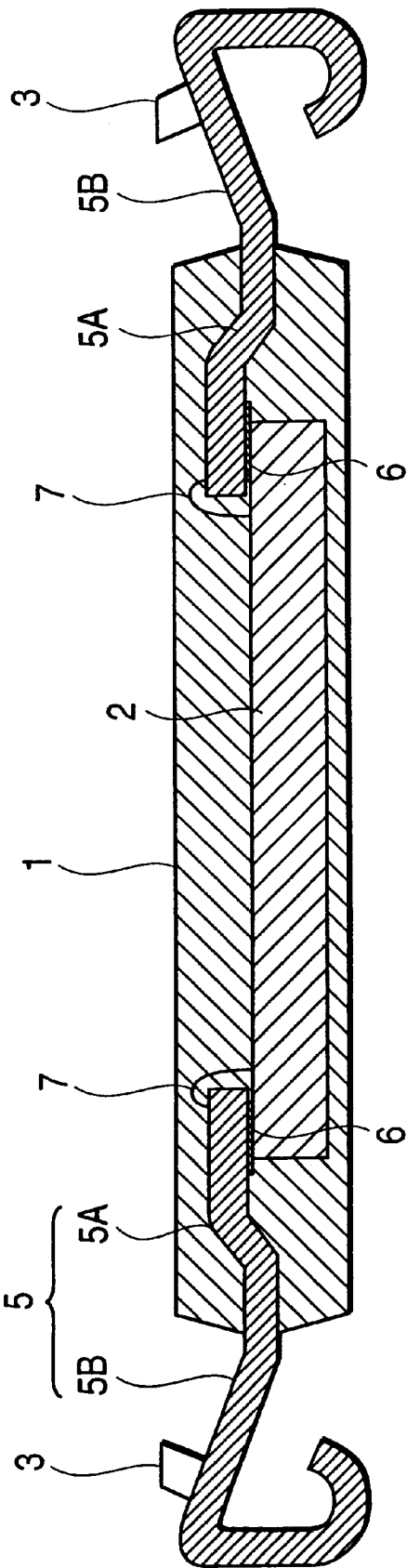
FIG. 25 is a cross section of the semiconductor device of the fourth embodiment.

FIG. 24 is a plan view of the semiconductor device of this embodiment, and FIG. 25 is a cross section of this semiconductor device.

In the TSOJ of this embodiment, the inner lead portions 5A of the leads 5 are electrically connected through Au wires 7 to the bonding pads 8 arranged along the periphery of the semiconductor chip 2. The inner lead portions 5A of the leads 5 and the semiconductor chip 2 are bonded together with the non-conductive adhesive 6.

The length of the inner lead portions 5A in the TSOJ of this embodiment is shorter than those of the previous embodiments 1 to 3, and so the adhesive 6 may be applied to the entire back of each inner lead portion 5A or to one spot of each inner lead portion 5A. In this case, too, by covering the edge parts of the major surface of the semiconductor chip 2 with the adhesive 6 as in the embodiment 2, and, e.g., extending the adhesive 6 beyond the edge of the major surface of the semiconductor chip 2 (see adhesive 6A of FIG. 29), it is possible to reliably prevent short-circuit defects between the inner lead portions 5A and the semiconductor chip 2 even when the thickness of the adhesive 6 is reduced. Further, by providing stoppers 3, 3 to the extension portions of the outer lead portions 5B as in the embodiment 3, the manufacturing yield and throughput of the stack type memory module can be improved.

Embodiment 5

Figure 26:
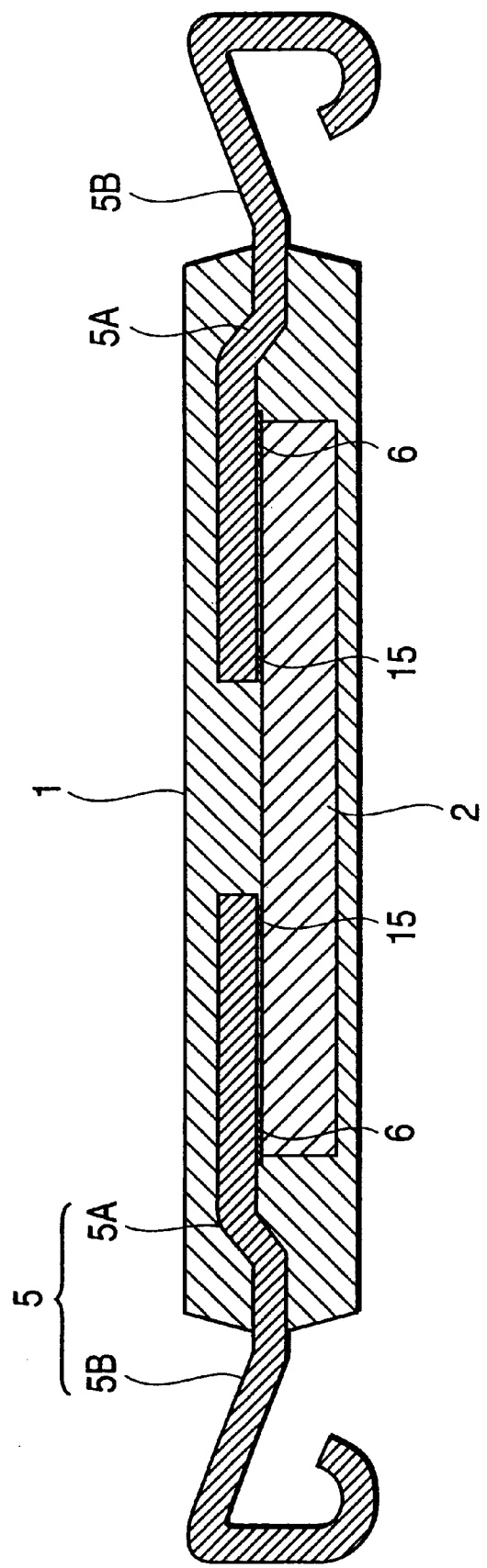
FIG. 26 is a cross section of a semiconductor device of a fifth embodiment of this invention.

FIG. 26 is a cross section of the semiconductor device of this embodiment.

In the TSOJ of this embodiment, the inner lead portions 5A of the leads 5 are electrically connected to Au bump electrodes 15 formed on the major surface of the semiconductor chip 2. The inner lead portions 5A of the leads 5 and the semiconductor chip 2 are bonded together with the non-conductive adhesive 6.

Because of the bump electrodes 15 used in place of the Au wires (7), the TSOJ of this embodiment can reduce the thickness of the resin from the top surface of the semiconductor chip 2 to the top surface of the package body 1, compared with those of the TSOJs of the preceding embodiments 1 to 4. This in turn leads to further reduction in the thickness of the package body 1.

In this case, too, by covering the edge parts of the major surface of the semiconductor chip 2 with the adhesive 6 as in the embodiment 2, and e.g., desirably extending the adhesive 6 beyond the edge of the major surface of the semiconductor chip 2, short-circuit failures between the inner lead portions 5A and the semiconductor chip 2 can be reliably prevented even when the adhesive 6 is thin. Further, the provision of the stoppers 3, 3 to the extension portions of the outer lead portions 5B as in the embodiment 3 can improve the manufacturing yield and throughput of the stack type memory module.

Embodiment 6

Figure 32:
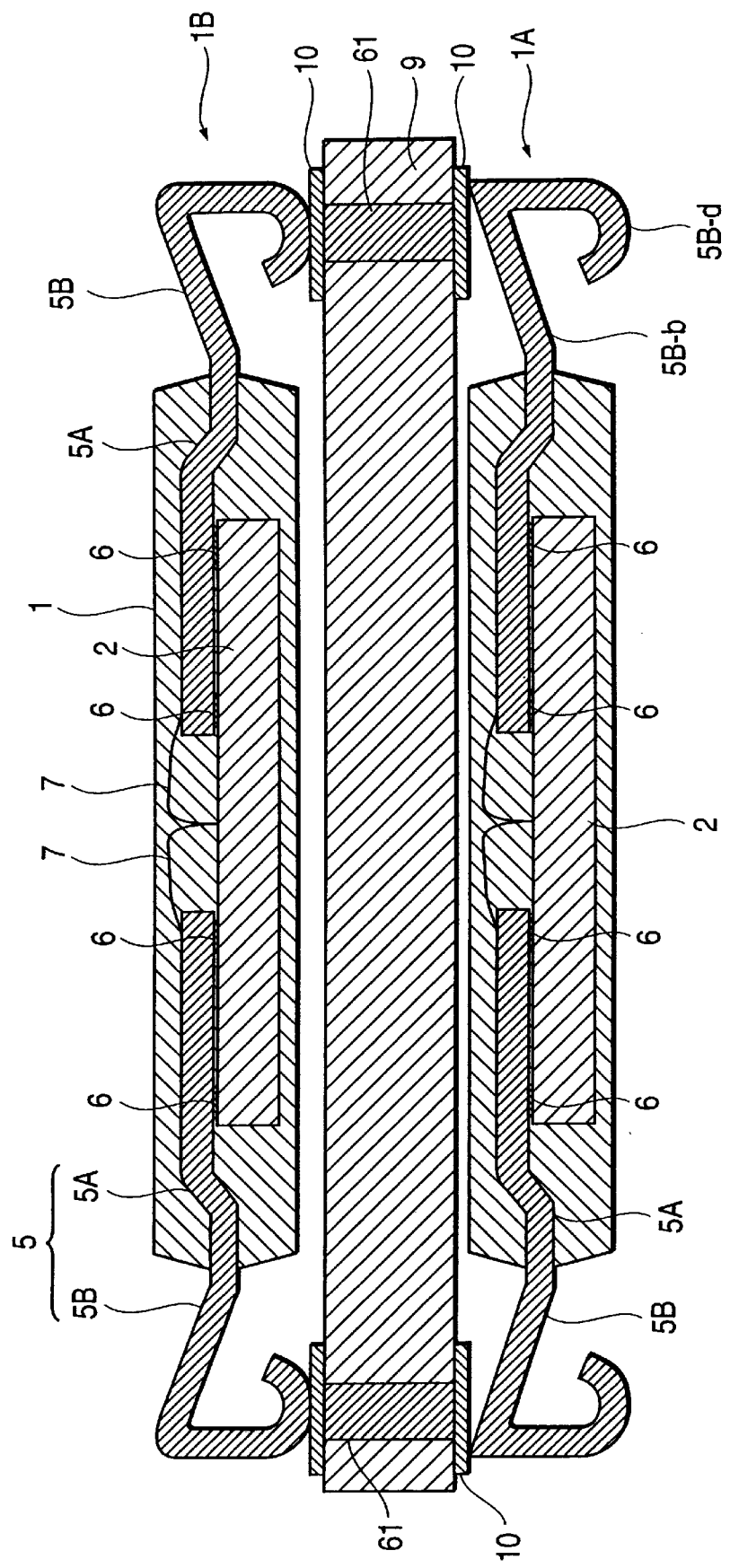
FIG. 32 is a cross-section of another example of a memory module with a plurality of semiconductor devices electrically connected to a printed circuit board.

FIG. 32 is a cross section of the semiconductor device of this embodiment.

In this embodiment, two TSOJs sandwich a printed circuit board 9, and corresponding leads of the two TSOJs are electrically connected to each other by conductors 61 extending through the printed circuit board. As can be appreciated from FIG. 32, the packaged semiconductor devices face in the same direction, such that the top of one packaged device (packaged device 1A) faces the printed circuit board 9 and the bottom of the other packaged device (packaged device 1B) faces the printed circuit board. This embodiment combines structures shown in FIGS. 13 and 14 adjacent opposed sides of a common printed circuit board 9, and having leads of the respective devices electrically connected to each other through the printed circuit board.

By mounting two TSOJs on a common printed circuit board positioned as shown in FIG. 32, necessary wiring can be simplified. Moreover, by using adhesive 6, a thinner structure can be achieved.

The present invention has been described in detail in conjunction with the above preferred embodiments. It should be noted that this invention is not limited to these embodiments and that various modifications may be made without departing from the spirit of the invention.

Figure 27:
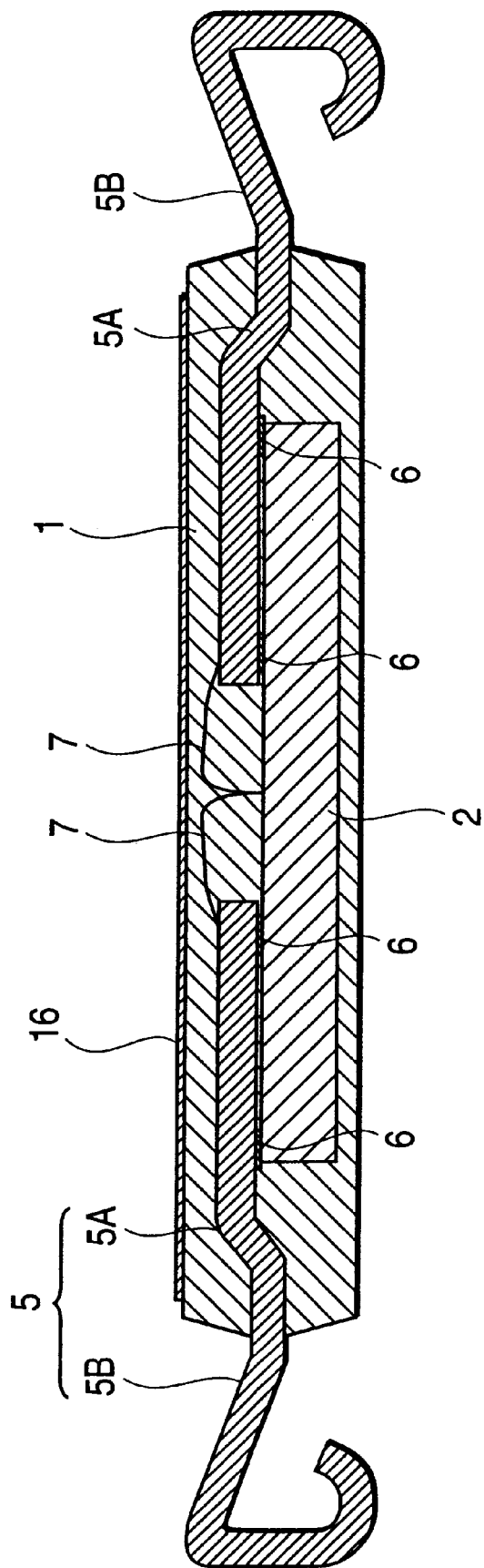
FIG. 27 is a cross section of a semiconductor device of further embodiment of this invention.
Figure 28:
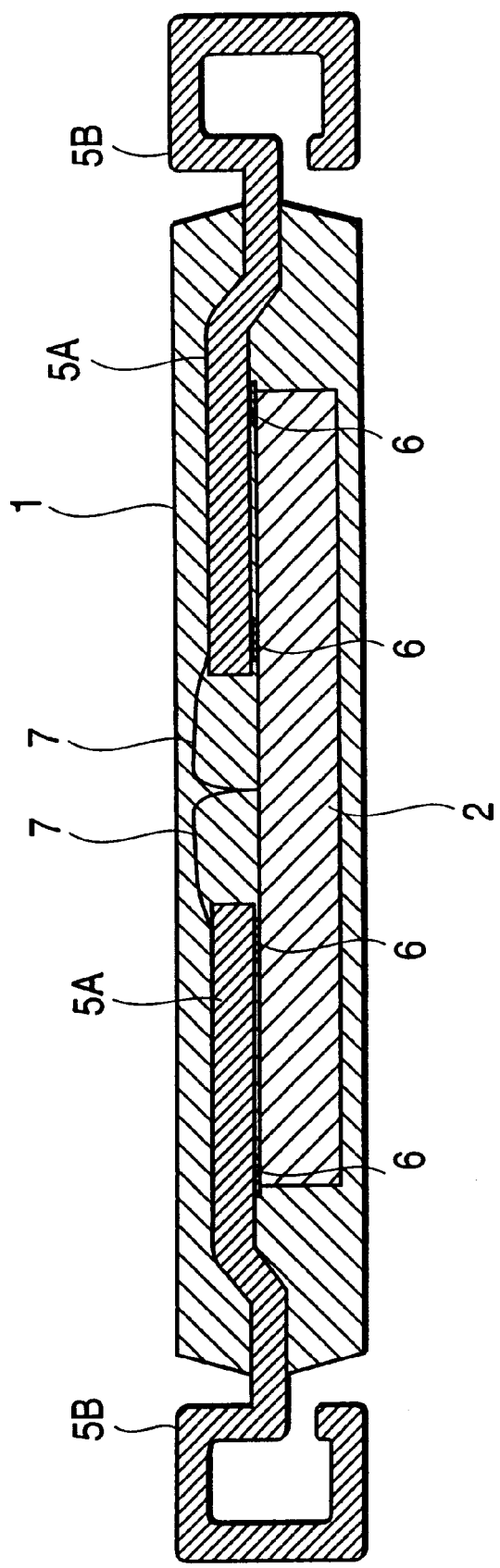
FIG. 28 is a cross section of a semiconductor device of further embodiment of this invention.

For example, even when the package body 1 is formed very thin by providing a light reflecting layer such as aluminum foil 16 on the surface of the package body 1, as shown in FIG. 27, degradation of characteristics such as data retention due to light can be prevented. It is also noted that the shapes of the outer lead portions 5B of the leads 5 are not limited to the shapes of the embodiments 1 to 4 but may take various shapes, such as shown in FIG. 28.

Figure 29:
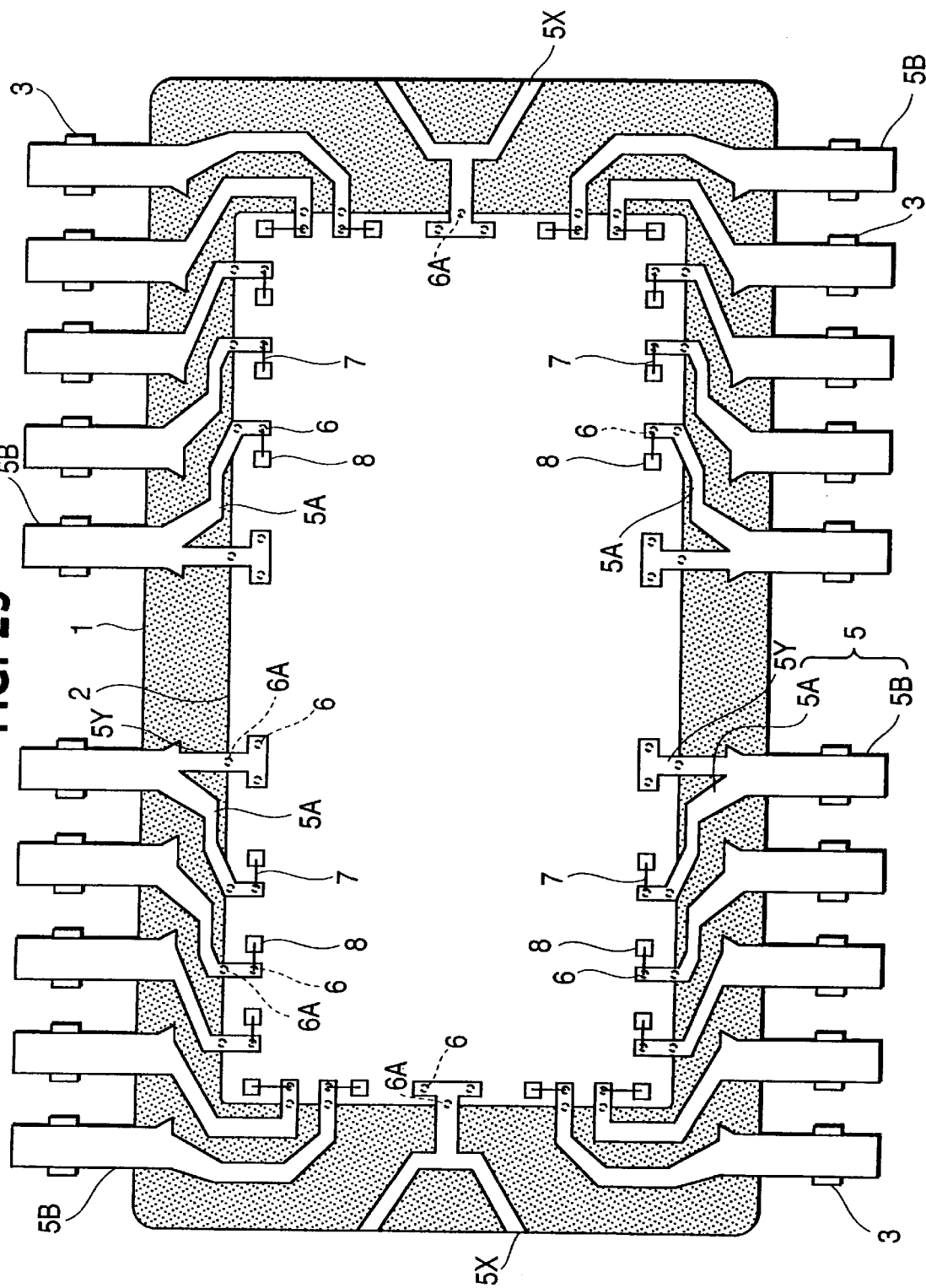
FIG. 29 is a plan view of a semiconductor device of a further embodiment of the present invention.

The adhesive can be provided between the chip and each of the leads formed from the lead frame, or can be provided between the chip and some of the leads. Illustratively, FIG. 29 shows adhesive 6, dispensed in spots (spots 6A desirably extending beyond the edge of the major surface of semiconductor chip 2), being provided between supporting leads 5X and the chip 2, between dummy leads 5Y (for stabilizing the longer sides of the chip during transfer molding, to prevent the chip from twisting) and the chip 2, and between the remaining leads (for electrical connection to bonding pads 8) and the chips 2. However, the adhesive can be provided between (1) the dummy leads and leads connected to Au wires, and (2) the chip; or just between the leads connected to Au wires and the chip.

The present invention is not limited to the TSOJ packages but can be adapted widely to other packages of LOC structure. It can also be adapted to chip-on-lead structure packages in which a semiconductor chip is mounted on the inner lead portions of the leads. Further, its application includes not only the packages sealing memory LSIs, but also packages where microcomputers and logic LSIs are sealed and stack type multichip modules using such packages.

Representative advantages of the present invention may be summarized as follows.

The semiconductor device of this invention can realize an ultrathin LSI package.

The semiconductor device of this invention can reduce manufacturing cost of the ultrathin LSI package.

The semiconductor device of this invention can realize a stacked type ultrathin multichip module.

The semiconductor device of this invention can improve the reliability and manufacturing yield of the ultrathin LSI package.

While the present invention has been described in detail and pictorially in the accompanying drawings it is not limited to such details since many changes and modifications recognizable to those of ordinary skill in the art may be made to the invention without departing from the spirit and the scope thereof.

What is claimed is:

1. A semiconductor device having inner lead portions, of leads, arranged adjacent a major surface of a semiconductor chip sealed in a package body, and having bonding pads on the major surface of the semiconductor chip, electrically connected to the inner lead portions, wherein the inner lead portions are bonded to the major surface of the semiconductor chip only with non-conductive adhesive, without a base film between the inner lead portions and the major surface of the semiconductor chip, wherein at least a part of the non-conductive adhesive is next to edge parts of the major surface of the semiconductor chip, and wherein the adhesive extends beyond edges of the major surface of the semiconductor chip.

2. A semiconductor device according to claim 1, wherein the bonding pads are electrically connected to the inner lead portions by wires.

3. A semiconductor device according to claim 1, further comprising outer lead portions of the leads, extending outward from sides of the package body, bent so that the package body can be surface mounted, and a part of the outer leads are provided with extension portions extending upward obliquely.

4. Surface mounted semiconductor devices, comprising a printed circuit board and two semiconductor devices according to claim 3, adjacent opposite surfaces of the printed circuit board, the major surface of each of said two semiconductor devices facing upwardly, said two semiconductor devices respectively being surface-mounted on the opposite surfaces of the printed circuit board.

5. Surface mounted semiconductor devices according to claim 4, wherein said printed circuit board has electrically conductive members extending therethrough, and corresponding outer lead portions of the two semiconductor devices are electrically connected to a same electrically conductive member, at opposite ends thereof.

6. A semiconductor device according to claim 1, further comprising outer lead portions of the leads, extending outward from sides of the packaged body, bent so that the packaged body can be surface mounted.

7. A semiconductor device having inner lead portions, of leads, arranged adjacent a major surface of a semiconductor chip sealed in a package body, and having bonding pads on the major surface of the semiconductor chip, electrically connected to the inner lead portions, wherein the inner lead portions are bonded to the major surface of the semiconductor chip only with non-conductive adhesive, without a base film between the inner lead portions and the major surface of the semiconductor chip, and wherein the adhesive is in a pattern of dots, between the inner lead portions and the major surface of the semiconductor chip.

8. A semiconductor device according to claim 7, wherein the bonding pads are electrically connected to the inner lead portions by wires.

9. A semiconductor device having inner lead portions, of leads, arranged adjacent a major surface of a semiconductor chip sealed in a package body, and having bonding pads on the major surface of the semiconductor chip, electrically connected to the inner lead portions, wherein the inner lead portions are bonded to the major surface of the semiconductor chip only with non-conductive adhesive, without a base film between the inner lead portions and the major surface of the semiconductor chip, and wherein a pattern of the adhesive, between a respective inner lead portion and parts of the major surface of the semiconductor chip adjacent the respective inner lead portion, is discontinuous.

10. A semiconductor device according to claim 9, wherein the bonding pads are electrically connected to the inner lead portions by wires.

11. A semiconductor device having inner lead portions, of leads, arranged adjacent a major surface of a semiconductor chip sealed in a package body, and having bonding pads on the major surface of the semiconductor chip, electrically connected to the inner lead portions, wherein the inner lead portions are bonded to the major surface of the semiconductor chip only with non-conductive adhesive, without a base film between the inner lead portions and the major surface of the semiconductor chip, and wherein the adhesive is located substantially only between the inner lead portions and parts of the major surface of the semiconductor chip adjacent to the inner lead portions.

12. A semiconductor device according to claim 11, wherein the bonding pads are electrically connected to the inner lead portions by wires.

13. A semiconductor device according to claim 11, further comprising outer lead portions of the leads, extending outward from sides of the package body, bent so that the package body can be surface mounted, and a part of the outer leads are provided with extension portions extending upward obliquely.

14. A surface mounted semiconductor device, comprising the semiconductor device according to claim 13 surface-mounted on a printed circuit board.

15. A semiconductor device according to claim 11, further comprising outer lead portions of the leads, extending outward from sides of the packaged body, bent so that the packaged body can be surface mounted.

16. A semiconductor device according to claim 15, wherein a pair of stoppers, extending toward a top surface of the package body, are provided respectively to both sides, in a width direction, of the outer lead portions of the leads extending outward from the sides of the package body.

17. A semiconductor device according to claim 16, wherein a width of lower ends of the outer lead portions is narrower than a width of parts of the outer lead portions closer to the package body in a direction along the outer lead portions.

18. A semiconductor device according to claim 17, wherein the outer lead portions include extension portions extending upward obliquely, a width of said extension portions being greater than the width of the lower ends of the outer lead portions.

19. Stacked semiconductor devices comprising at least two semiconductor devices according to claim 18, lower ends of outer lead portions of one of the at least two semiconductor devices being positioned on corresponding outer lead portions of another of the at least two semiconductor devices at the location of the stoppers, so as to provide said one of the at least two semiconductor devices stacked on the other of the at least two semiconductor devices.

20. Stacked semiconductor devices comprising at least two semiconductor devices according to claim 16, lower ends of outer lead portions of one of the at least two semiconductor devices being positioned on corresponding outer lead portions of another of the at least two semiconductor devices at the location of the stoppers, so as to provide said one of the at least two semiconductor devices stacked on the other of the at least two semiconductor devices.

21. A semiconductor device according to claim 16, wherein the pair of stoppers are formed by bending a dam of a lead frame that interconnects the outer lead portions.

22. A multichip module structure, comprising a plurality of semiconductor devices of claim 11 stacked vertically on a printed circuit board.

23. A semiconductor device in which inner lead portions of leads are arranged adjacent to a major surface of a semiconductor chip sealed in a package body, and bump electrodes on the major surface of the semiconductor chip are electrically connected to the inner lead portions, wherein the inner lead portions are bonded to the major surface of the semiconductor chip only with non-conductive adhesive, without a base film between the inner lead portions and the major surface of the semiconductor chip.

24. A semiconductor device according to claim 23, wherein at least a part of the non-conductive adhesive is next to edge parts of the major surface of the semiconductor chip.

25. A semiconductor device according to claim 23, wherein the non-conductive adhesive is applied to a plurality of locations, between the major surface of the semiconductor chip and the inner lead portions.

26. A semiconductor device of a multichip module structure, wherein a plurality of semiconductor devices of claim 25 are stacked vertically on a printed circuit board.

27. A semiconductor device in which inner lead portions of leads are arranged adjacent a major surface of a semiconductor chip sealed in a package body, and bonding pads on the major surface of the semiconductor chip are electrically connected to the inner lead portions, the inner lead portions being bonded to the major surface of the semiconductor chip with non-conductive adhesive, the major surface of the semiconductor chip having first parts with the inner lead portions adjacent thereto and second parts not having the inner lead portions adjacent thereto, the non-conductive adhesive being provided next to substantially only the first parts of the major surface of the semiconductor chip.

28. A semiconductor device, comprising:
   a semiconductor chip having bonding pads formed on a major surface of the semiconductor chip, and a dicing area at an edge of the major surface of the semiconductor chip;
   a passivation film covering the major surface except said bonding pads and said dicing area;
   a package body encapsulating said semiconductor chip;
   leads each having an inner portion inside of said package body and an outer portion outside of said package body, said inner portion being arranged adjacent said major surface of said semiconductor chip;
   bonding wires each electrically connecting one of the bonding pads and one of said leads; and
   a non-conductive adhesive bonding said leads to said semiconductor chip, wherein said non-conductive adhesive covers said dicing area between said lead and said major surface of said semiconductor chip.

29. A semiconductor device according to claim 28, further comprising a polyimide film covering said passivation film and not covering said bonding pads and said dicing area.

30. A semiconductor device according to claim 28, wherein said inner portion of each lead has a bonding portion to which said bonding wire is connected, and said non-conductive adhesive bonding said leads to said semiconductor chip is located adjacent said bonding portion.

31. A semiconductor device according to claim 28, wherein said major surface of the semiconductor chip has a tetragonal shape having longer sides and shorter sides, and said bonding pads are arranged at a central part of said major surface in a direction of said longer sides.

32. A semiconductor device according to claim 28, wherein said major surface of the semiconductor chip has a tetragonal shape having longer sides and shorter sides, and said bonding pads are arranged at a peripheral portion of said major surface along said longer and shorter sides.

33. A semiconductor device, comprising:
   a semiconductor chip having a major surface, including a dicing area at an edge of the major surface of the semiconductor chip;
   a passivation film covering the major surface except said dicing area;
   a package body encapsulating said semiconductor chip;
   a lead having a first portion adjacent said major surface of said semiconductor chip and a second portion extending outside of said package body; and
   a non-conductive adhesive bonding said lead to said semiconductor chip, wherein said non-conductive adhesive covers said dicing area, and extends between said lead and said major surface of said semiconductor chip.

34. A semiconductor device according to claim 33, wherein said package body has longer sides and shorter sides in a tetragonal shape surface corresponding to said major surface of said semiconductor chip, and said major surface of said semiconductor chip has a tetragonal shape including longer sides and shorter sides, and wherein said lead protrudes to outside of said body intersecting a shorter side of the major surface of said semiconductor chip and a shorter side of said tetragonal shape surface of said package body.

35. A semiconductor device according to claim 33, wherein said package body has longer sides and shorter sides in a tetragonal shape surface corresponding to said major surface of said semiconductor chip, and said major surface of said semiconductor chip has a tetragonal shape including longer sides and shorter sides, and wherein a lead protrudes to outside of said body intersecting a longer side of said semiconductor chip and a longer side of said tetragonal shape surface of said package body.

36. A semiconductor device according to claim 35, further comprising a bonding pad formed on said major surface of said semiconductor chip and a bonding wire electrically connecting said lead and said bonding pad.

* * * * *